US012765384B2

(12) United States Patent
Li et al.

(10) Patent No.: US 12,765,384 B2
(45) Date of Patent: Oct. 13, 2026

(54) PACKAGE INCLUDING A DUMMY BAR AND METHODS OF FORMING THE PACKAGE

(71) Applicant: Taiwan Semiconductor Manufacturing Company Limited, Hsinchu (TW)

(72) Inventors: Ching-Chen Li, Hsinchu City (TW); Chin-Chuan Chang, Zhudong Township (TW); Chen-Hsuan Tsai, Taitung City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 714 days.

(21) Appl. No.: 18/321,116

(22) Filed: May 22, 2023

(65) Prior Publication Data

US 2024/0395730 A1 Nov. 28, 2024

(51) Int. Cl.

*H01L 23/00* (2006.01)
*H10W 42/00* (2026.01)
*H10W 70/65* (2026.01)
*H10W 74/01* (2026.01)
*H10W 74/10* (2026.01)
*H10W 90/00* (2026.01)

(52) U.S. Cl.

CPC ......... *H10W 42/121* (2026.01); *H10W 70/65* (2026.01); *H10W 74/01* (2026.01); *H10W 74/114* (2026.01); *H10W 90/00* (2026.01)

(58) Field of Classification Search

CPC .. H10P 72/74; H10P 72/7424; H10W 42/121; H10W 70/093; H10W 70/614; H10W 70/65; H10W 72/823; H10W 74/01; H10W 74/114; H10W 74/117; H10W 76/12; H10W 90/00; H10W 90/20; H10W 90/297; H10W 90/701

See application file for complete search history.

(56) References Cited

U.S. PATENT DOCUMENTS

| | | | | |
|---|---|---|---|---|
| 12,183,723 B2 * | 12/2024 | Su | H10D 1/692 |
| 2022/0157777 A1 * | 5/2022 | Yang | H10W 42/121 |
| 2022/0262766 A1 * | 8/2022 | Chen | H10P 72/74 |
| 2023/0044797 A1 * | 2/2023 | Su | H10D 1/692 |
| 2023/0128903 A1 * | 4/2023 | Bertrand | H10W 40/22 257/712 |
| 2023/0154893 A1 * | 5/2023 | Hiner | H10P 72/74 257/737 |
| 2023/0387075 A1 * | 11/2023 | Tsai | H10W 70/611 |
| 2024/0243098 A1 * | 7/2024 | Tsao | H10B 80/00 |
| 2025/0174576 A1 * | 5/2025 | Tsao | H10W 42/121 |

OTHER PUBLICATIONS

Jianq Chyun Intellectual Property Office; TW Application No. 112127083; Office Action mailed May 22, 2024; 16 pages.

* cited by examiner

*Primary Examiner* — Jaehwan Oh

(74) *Attorney, Agent, or Firm* — The Marbury Law Group, PLLC

(57) ABSTRACT

A package includes a first die and a second die in an encapsulant layer, and a dummy bar in the encapsulant layer and adjacent a gap between the first die and the second die. A method of forming a package includes attaching a first die and a second die to a surface, attaching a dummy bar to the surface adjacent a gap between the first die and the second die, and forming an encapsulant layer on the first die, the second die and the dummy bar.

20 Claims, 26 Drawing Sheets

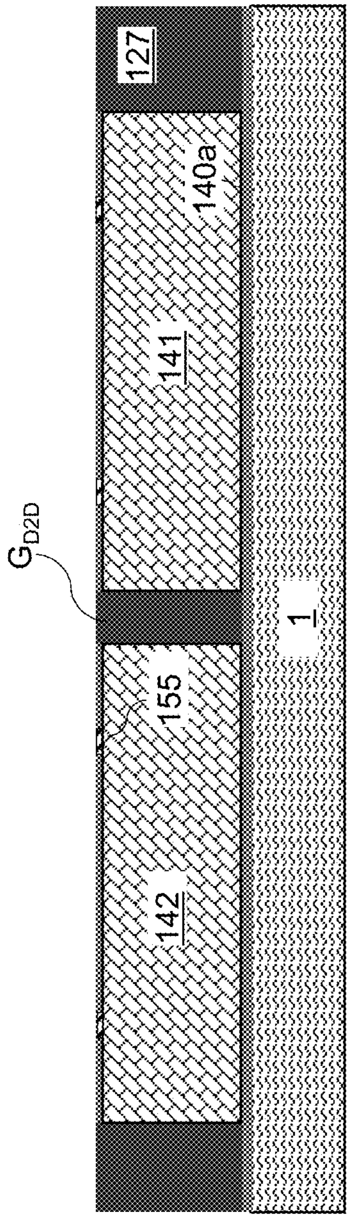
FIG. 2B
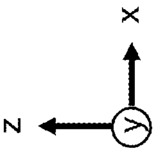

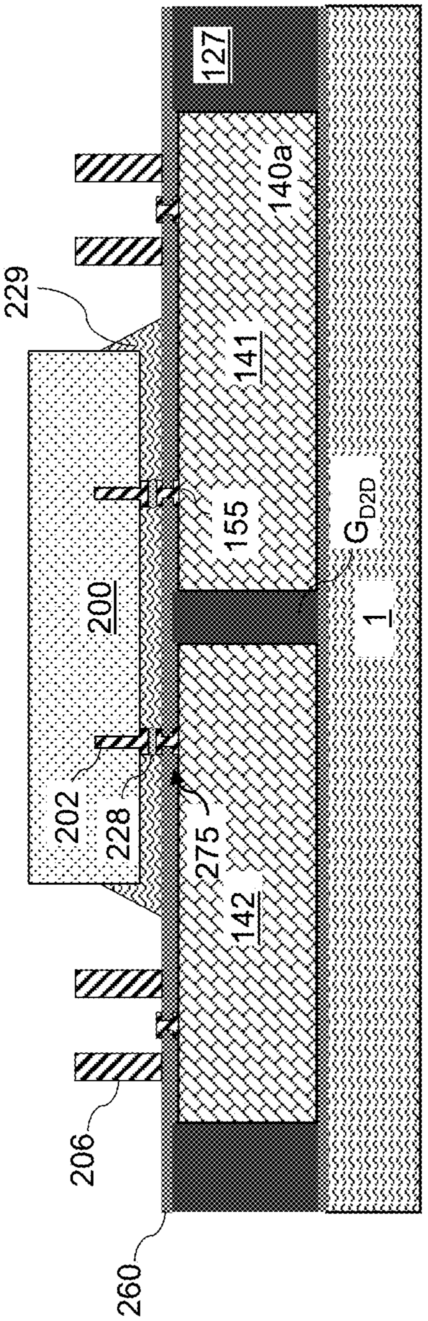
FIG. 2D
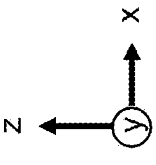

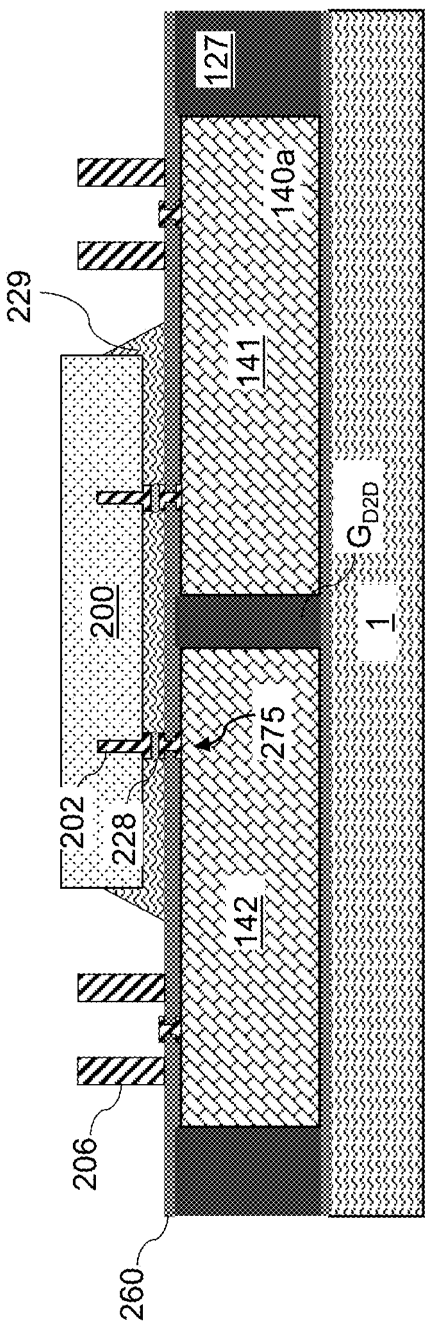
FIG. 2E
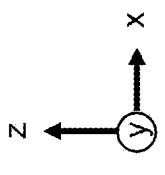

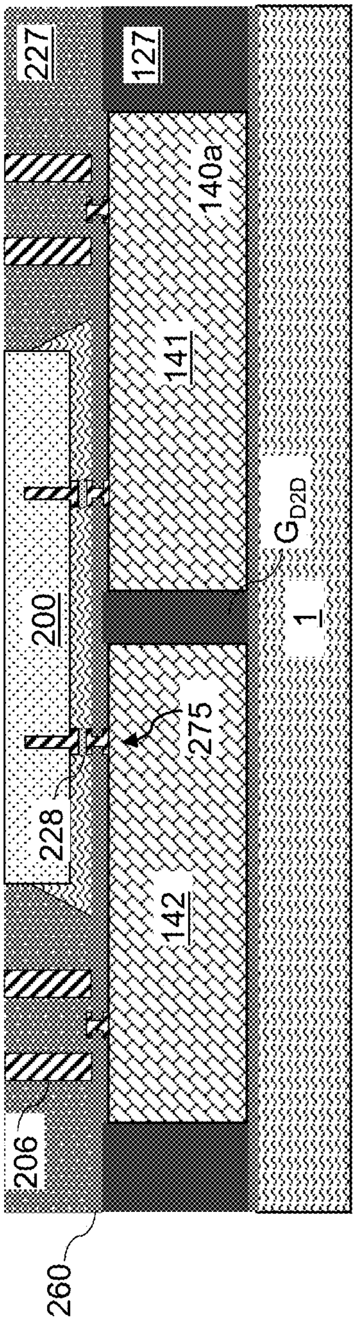
FIG. 2F
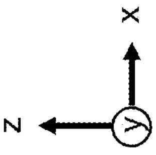

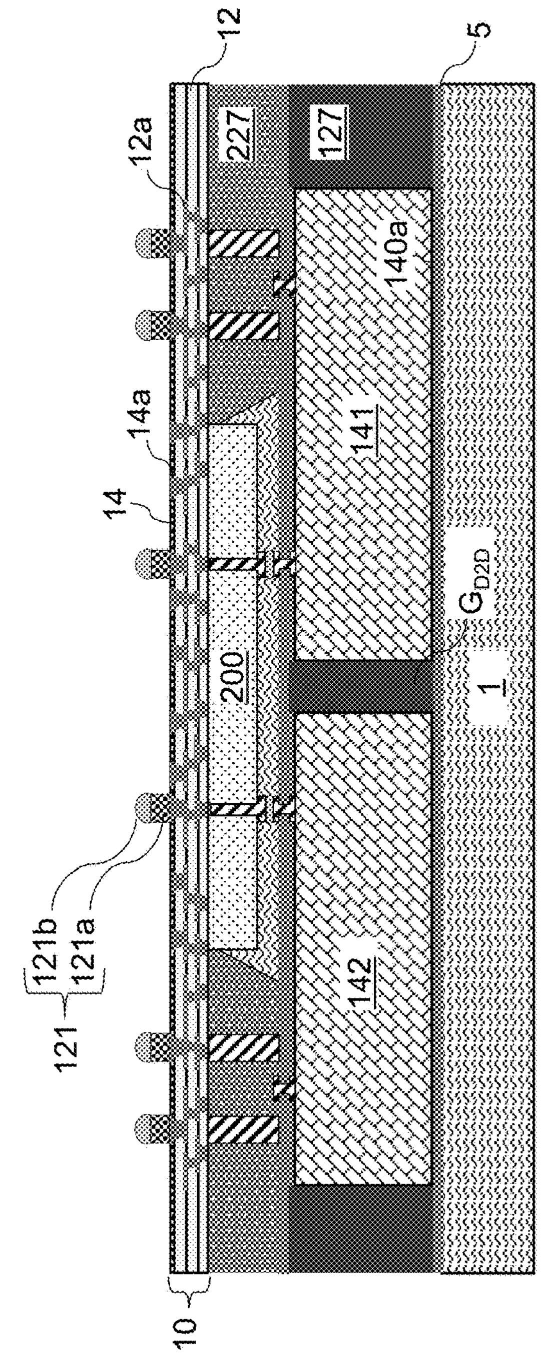
FIG. 2G
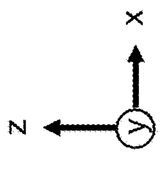

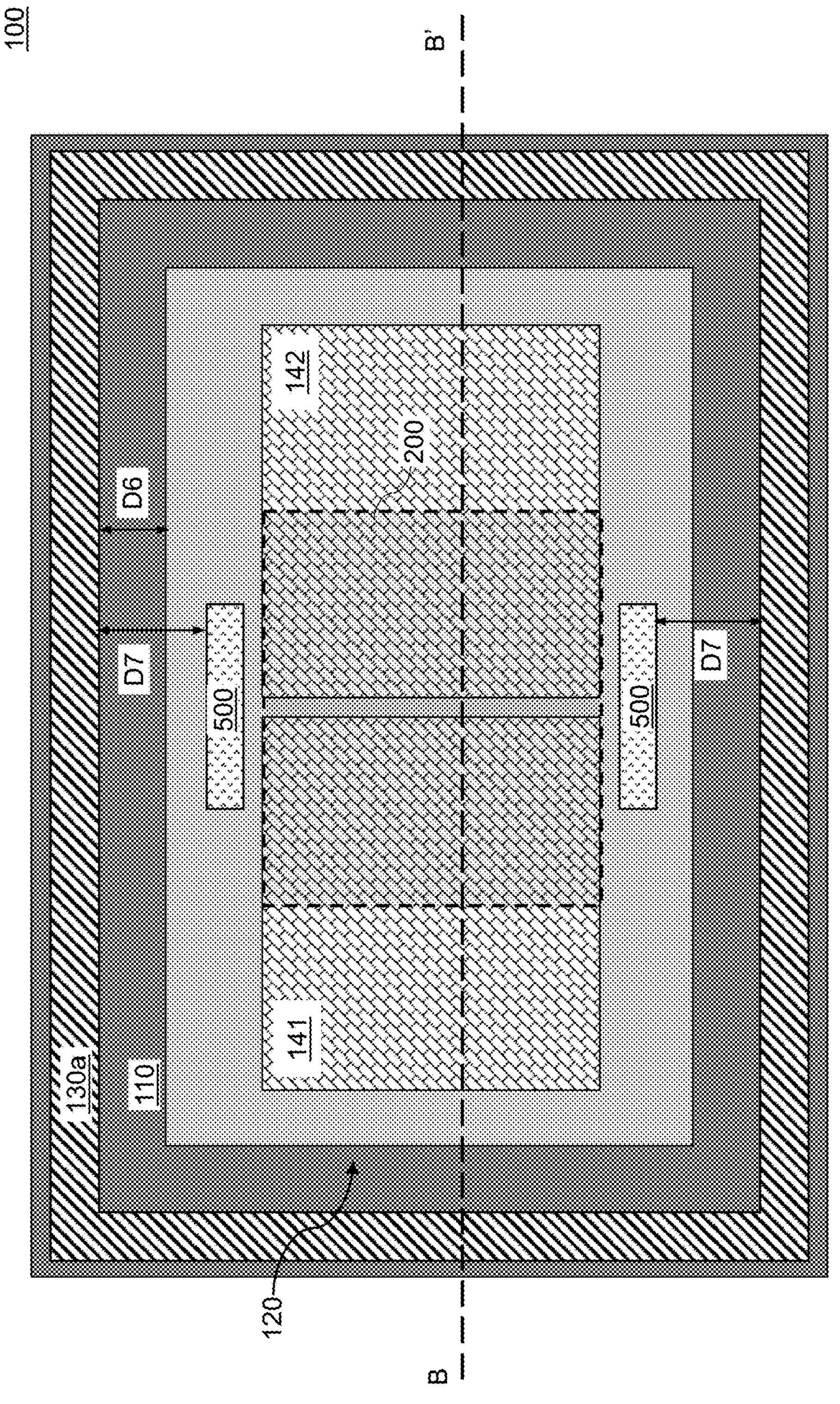
FIG. 4B
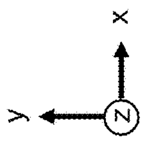

PACKAGE INCLUDING A DUMMY BAR AND METHODS OF FORMING THE PACKAGE

BACKGROUND

Typical packages may include a plurality of dies (e.g., semiconductor dies) and an upper molding material layer around the plurality of dies. Mechanical stress may arise in a package due to a number of factors, including thermal expansion, mechanical bending, and changes in the electrical properties of the material.

For example, when the temperature of the package changes, the different materials in the package may expand or contract at different rates due to different coefficients of thermal expansion (CTE) of the varying materials used in the package. These variations in thermal expansion and contraction may cause stress at the interfaces between them. In instance in which the stress exceeds the strength of the material, cracks may form in the package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2B is a vertical cross-sectional view of an intermediate structure after grinding of the encapsulant layer, according to one or more embodiments.

FIG. 2D is a vertical cross-sectional view of an intermediate structure including the LSI die according to one or more embodiments.

FIG. 2E is a vertical cross-sectional view of an intermediate structure after thinning the LSI die, according to one or more embodiments.

FIG. 2F is a vertical cross-sectional view of an intermediate structure including the lower molding layer according to one or more embodiments.

FIG. 2G is a vertical cross-sectional view of an intermediate structure including the RDL portion and C4 bumps, according to one or more embodiments.

FIG. 4B is a plan view (e.g., top-down view) of the package according to one or more embodiments.

DETAILED DESCRIPTION

Figure 1A:
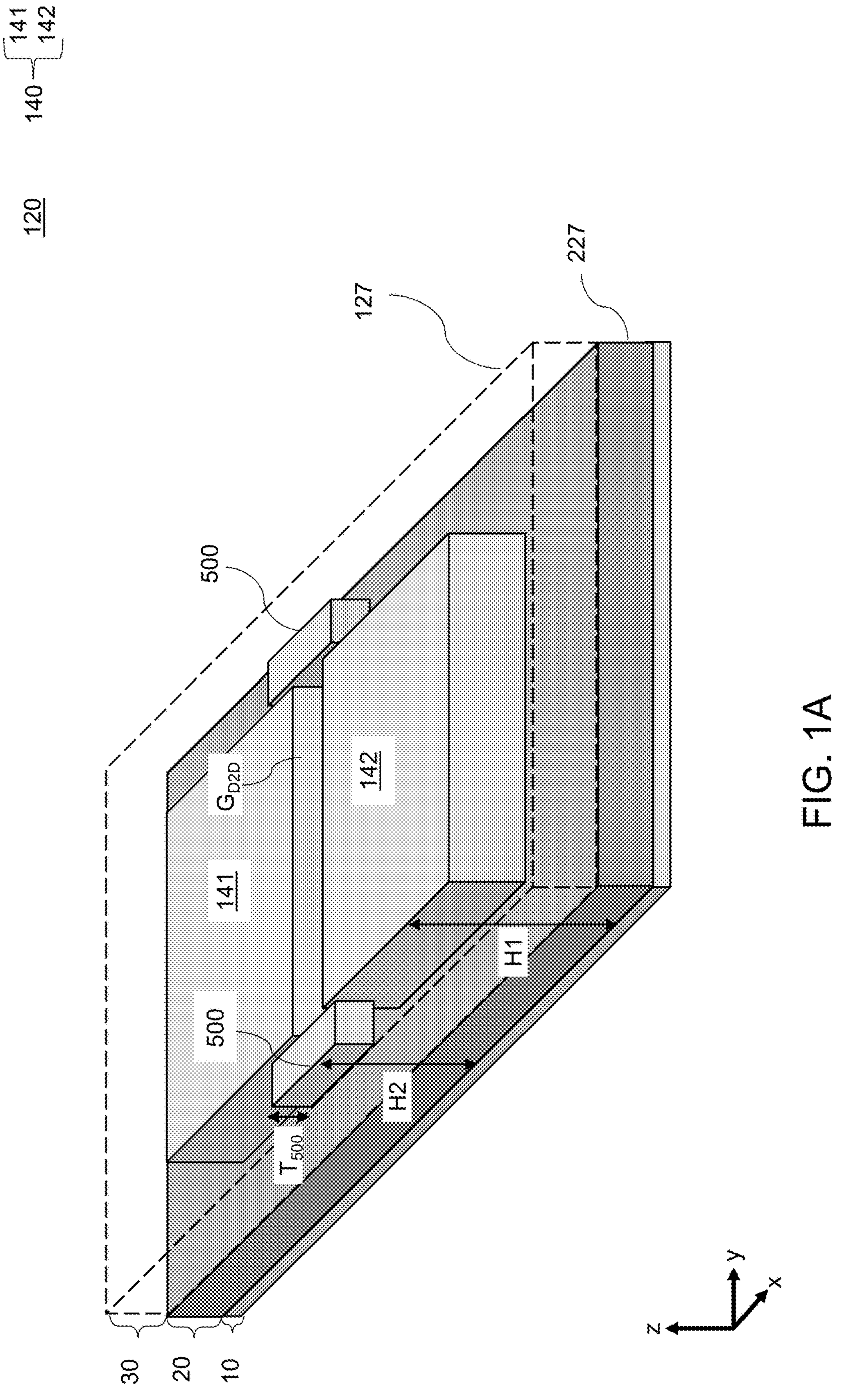
FIG. 1A is a perspective view of a package module including a dummy bar according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Mechanical bending may also be a source of stress in packages (e.g., package modules). Mechanical bending may occur when the package is subjected to external forces, such as during the assembly of the package or when it is in use. In instances in which the bending is too great, a material in the package may crack and/or suffer areas of delamination. In particular, insufficient die-to-die bending strength, may cause the package to suffer yield loss due to a die-to-die crack.

One or more embodiments of the present disclosure may include a package including one or more dummy bars. The dummy bar may enhance a bending strength (e.g., die-to-die bending strength) and displacement in the package. The dummy bar may mitigate against the risk of die-to-die crack due to a bending stress on the package and therefore, improve yield loss.

In at least one embodiment, the package may include a three-dimensional integrated package having a fan-out design. In at least one embodiment, the package may include a package module having a lower module portion. The lower module portion may include a lower molded layer and through vias in the lower molded layer. The lower module portion may also include a local silicon interconnect (LSI) die in the lower molded layer. The package module may also include an upper module portion on the lower module portion. The upper module portion may include an encapsulant layer (upper molding layer) and one or more dies (e.g., semiconductor dies such as system on chip (SOC) dies) attached to the lower module portion in the encapsulant layer.

One or more dummy bars may also be located in the encapsulant layer. The dummy bar may be located over the lower module portion. In at least one embodiment, the dummy bar may be adjacent to a gap between dies (e.g., die-to-die gap) in the upper module portion.

In at least one embodiment, a material of the dummy bar may include silicon, silica, glass, ceramic materials, metal materials, etc. However, other suitable materials may be used. The dummy bar may have a rectangular shape in a plan view, although other shapes are possible. A width of the gap may be in a range from 1 μm to 5000 μm (e.g., about 100 μm). A short side of the dummy bar may be in a range from 0.1 mm to 10.0 mm (e.g., about 1.2 mm), and a long side of the dummy bar may be in a range from 1 mm to 30 mm (e.g., about 6 mm). A thickness of the dummy bar may be in a range from 10 μm to 5000 μm.

In at least one embodiment, an upper surface of the dummy bar may be substantially coplanar with an upper surface of a die (e.g., semiconductor die) in the upper module portion of the package. In at least one embodiment, a distance between the dummy bar and the die may be as small as possible so that a size of the dummy bar may be as large as possible. The distance between the dummy bar and the die may depend, for example, on a die pick and place (PNP) accuracy.

A dummy bar with a large size (e.g., large bar length) may provide better performance with various gap length between dies in the upper module portion. In particular, a large dummy bar size may promote improvements in bending strength characteristics. Thus, a distance between the dummy bar and an edge of the lower molded portion may be as small as possible. The distance may also depend on a PNP capability to handle a higher aspect ratio die.

Figure 1B:
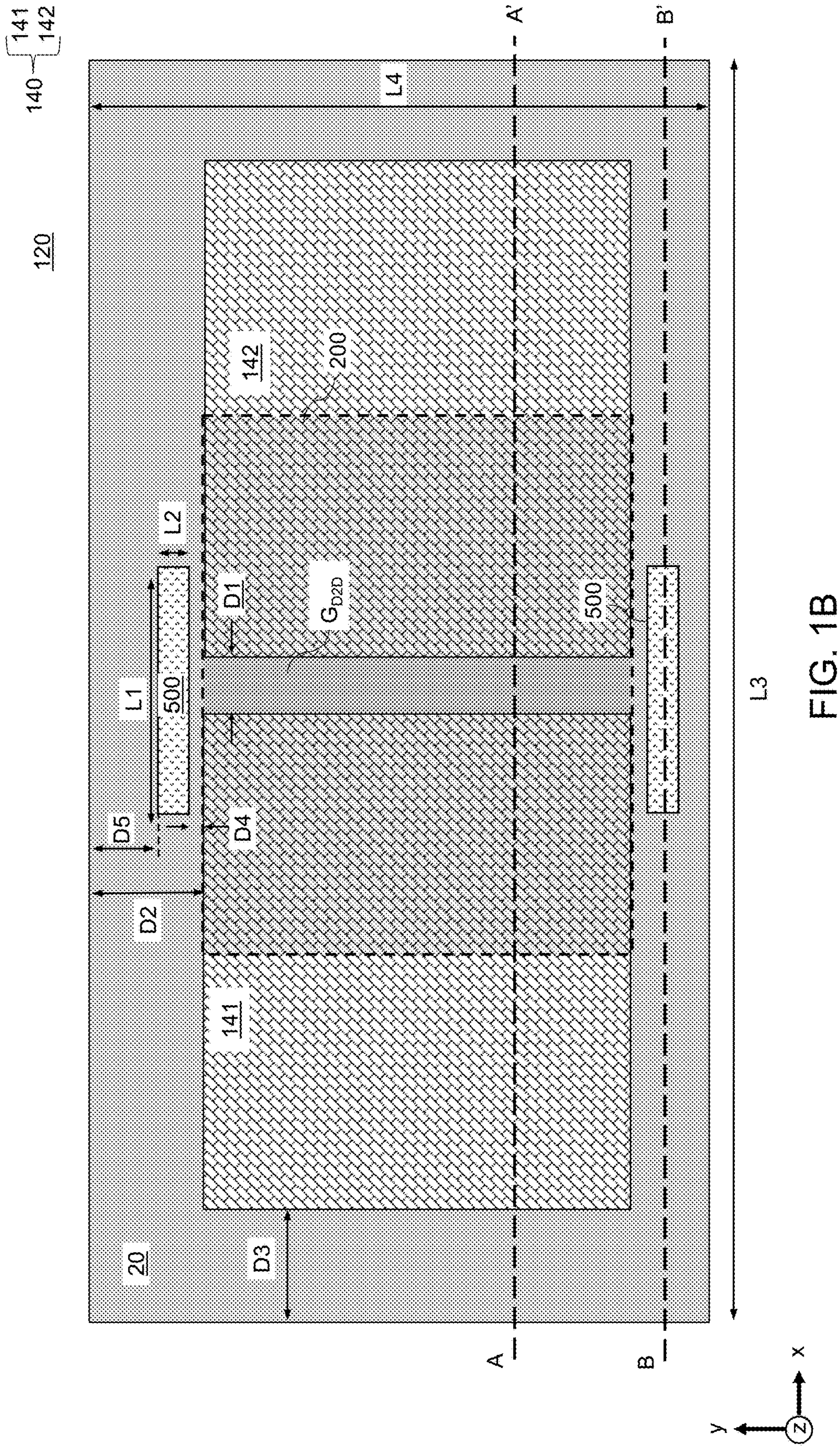
FIG. 1B is a plan view (e.g., top-down view) of the package module shown in FIG. 1A, according to one or more embodiments.
Figure 1C:
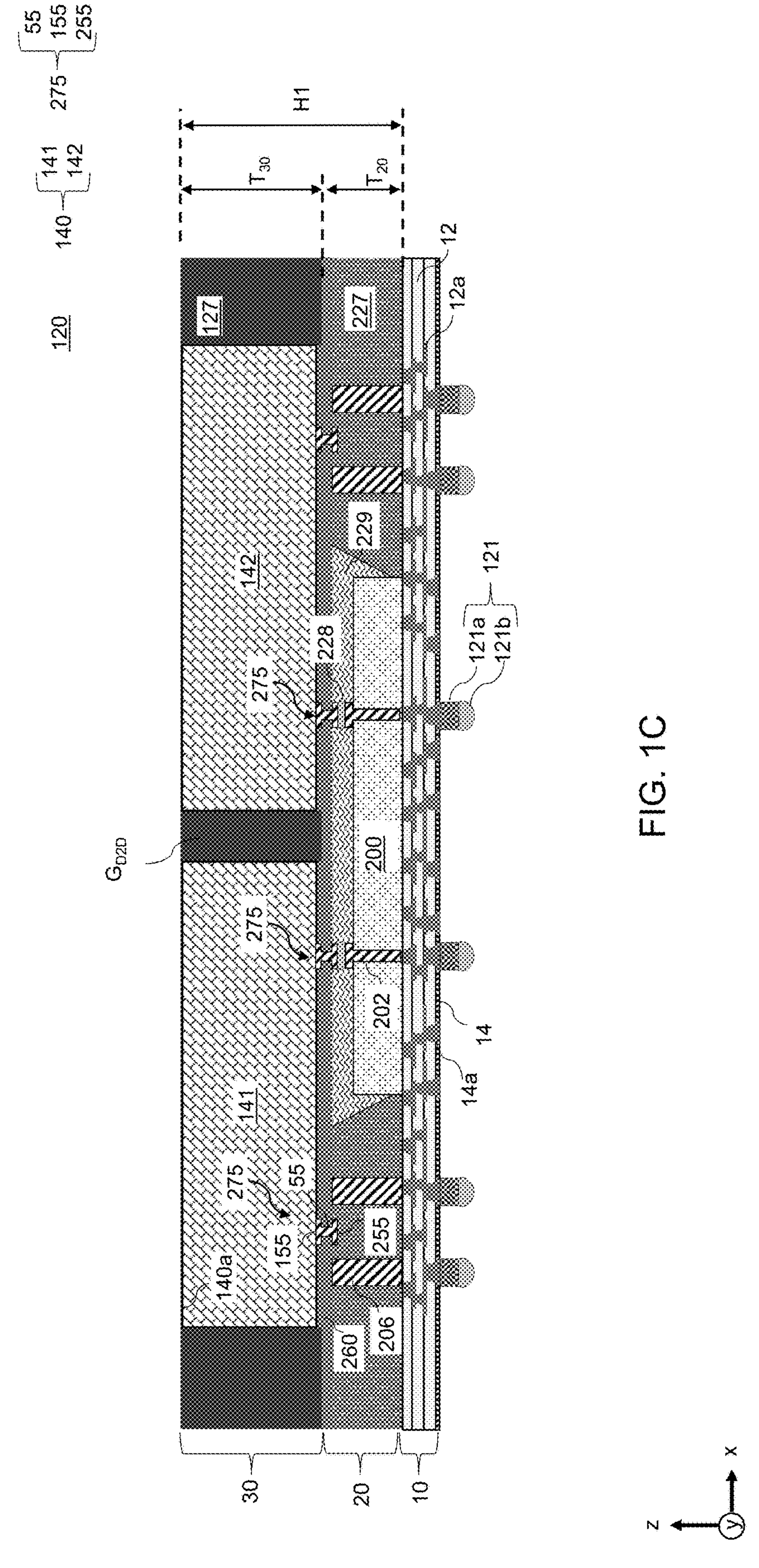
FIG. 1C is a vertical cross-sectional view of the package module along the cut line A-A' in FIG. 1B, according to one or more embodiments.
Figure 1D:
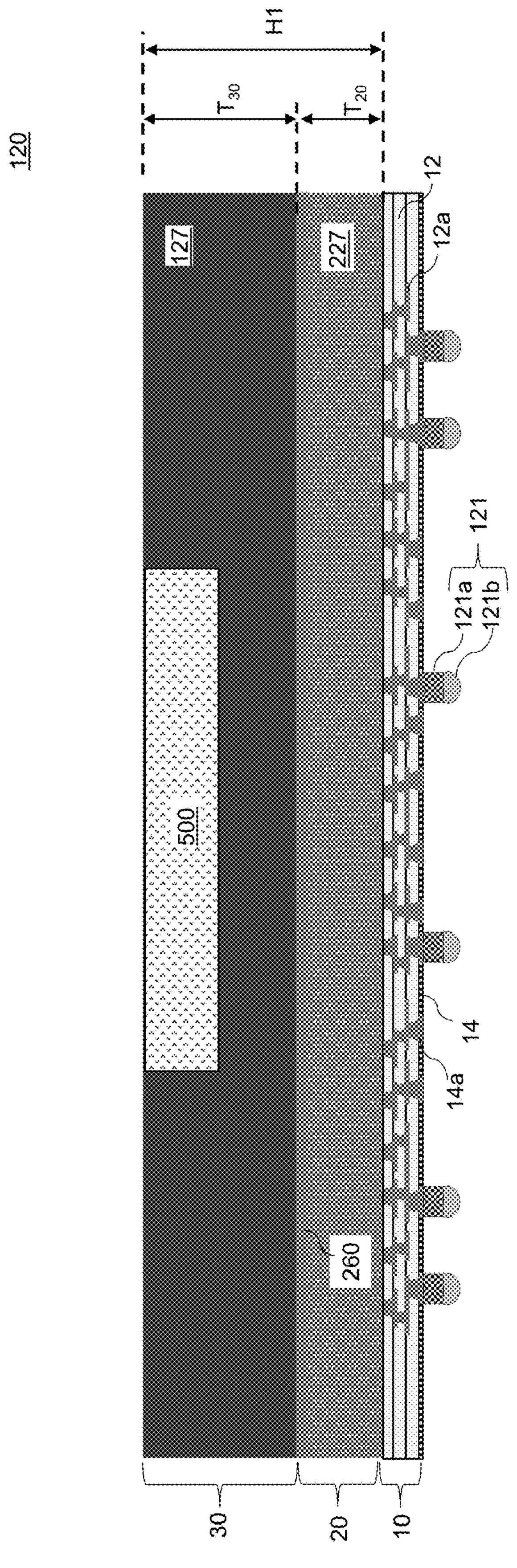
FIG. 1D is a vertical cross-sectional view of the package module along the cut line B-B' in FIG. 1B, according to one or more embodiments.

FIG. 1A is a perspective view of a package module 120 including a dummy bar 500 according to one or more embodiments. FIG. 1B is a plan view (e.g., top-down view) of the package module 120 shown in FIG. 1A, according to one or more embodiments. FIG. 1C is a vertical cross-sectional view of the package module 120 along the cut line A-A' in FIG. 1B, according to one or more embodiments. FIG. 1D is a vertical cross-sectional view of the package module 120 along the cut line B-B' in FIG. 1B, according to one or more embodiments. The package module 120 may be included, for example, in a package (e.g., semiconductor package).

It should be noted that while the dummy bar 500 may be described by the present disclosure as being located in the package module 120, the use of the dummy bar 500 is not limited to a package or package module having any particular structure or configuration. In particular, the dummy bar 500 may be used in any package or package module having any structure or configuration.

As illustrated in FIG. 1A, the package module 120 may include a redistribution layer (RDL) portion 10 and a lower module portion 20 on the RDL portion 10. The lower module portion 20 may include a lower molding layer 227 and a local silicon interconnect die (LSI) die (not shown) in the lower module portion 20. The package module 120 may also include an upper module portion 30 on the lower module portion 20 (e.g., on the lower molding layer 227). The upper module portion 30 may include a plurality of dies 140 attached to a surface of the lower module portion 20. The plurality of dies 140 may include a first die 141 and a second die 142 adjacent to the first die 141 in the x-direction. The LSI die in the lower module portion 20 may electrically couple the first die 141 to the second die 142.

It should be noted that although the package module 120 is illustrated as including a particular number of the dies 140 with a particular arrangement, the number of dies 140 and the arrangement of the dies 140 is not limited to any particular number and arrangement. In particular, the package module 120 may include any number and arrangement of the dies 140.

The first die 141 and second die 142 may be separated in the upper module portion 30 by a gap $G_{D2D}$ (e.g., die-to-die gap). The upper module portion 30 may also include one or more dummy bars 500 (e.g., dummy dies) adjacent the gap $G_{D2D}$. The dummy bar 500 may be located over the lower module portion 20. A center of the dummy bar 500 in the x direction may be substantially aligned with a center of the gap $G_{D2D}$ in the x-direction. As illustrated in FIG. 1A, in at least one embodiment, the package module 120 may include a pair of dummy bars 500 located on opposite sides of the gap $G_{D2D}$ in the y-direction. A thickness $T_{500}$ of the dummy bar 500 may be in a range from 10 μm to 5000 μm. An upper surface of the upper module portion 30 may be constituted at least in part by an upper surface of the dummy die 500, an upper surface of the first die 141 and an upper surface of the second die 142.

The upper module portion 30 may also include an encapsulant layer 127 (e.g., molding material layer). The dummy bar 500, the first die 141 and the second die 142 may be located in (e.g., encapsulated by) the encapsulant layer 127. The encapsulant layer 127 may be located in the gap $G_{D2D}$. The encapsulant layer 127 may also be located between the dummy bar 500 and the first and second dies 141, 142 in the y-direction, and between the dummy bar 500 and an edge of the lower module portion 20 in the y-direction. An upper surface of the encapsulant layer 127 may also be substantially coplanar with the upper surface of the dummy bar 500, the upper surface of the first die 141 and the upper surface of the second die 142. Thus, a height H1 (e.g., measured from the RDL portion 10) of an upper surface of the encapsulant layer 127 may be substantially equal to a height H2 of an upper surface of the dummy bar 500.

It should be noted that while the dummy bar 500 is illustrated in FIG. 1A as having an upper surface substantially coplanar with the upper surface of the encapsulant layer 127, the upper surface of the first die 141 and the upper surface of the second die 142, the configuration and orientation of the dummy bar 500 is not limited to that in FIG. 1A. In at least one embodiment, the upper surface of the dummy bar 500 may be below the upper surface of the encapsulant layer 127. In at least one embodiment, the the dummy bar 500 may be attached to the lower module portion 20.

The dummy bar 500 may enhance a bending strength (e.g., die-to-die bending strength) and displacement in the package module 120. The dummy bar 500 may help to reduce a risk of die-to-die crack (e.g., a crack in the encapsulant layer 127 in or around the die-to-die gap $G_{D2D}$) due to a bending stress on the package module 120 (e.g., bending stress on a package including the package module 120) and therefore, improve yield loss.

Referring to FIG. 1B, the encapsulant layer 127 has been omitted from FIG. 1B for ease of understanding. An outline of an LSI die 200 in the lower module portion 20 is indicated by dashed lines in order to understand a location of the dummy bars 500 relative to the location of the LSI die 200.

As illustrated in FIG. 1B, the LSI die 200 may be located under the dies 140. In particular, a center of the LSI die 200 in the x-direction may be substantially aligned with a center of the gap $G_{D2D}$ in the x-direction. The dummy bars 500 may be formed outside the LSI die 200 in the plan view. While the example in FIG. 1B includes a pair of dummy bars 500 located on opposing sides of the gap $G_{D2D}$ in the y-direction, more or fewer numbers of dummy bars 500 may be used in a package module 120 within the contemplated scope of disclosure.

The dummy bars 500 may have a rectangular shape in the plan view, although other shapes such as circles, ovals, polygons, etc. are possible. The dummy bars 500 may have a long side having a length L1 perpendicular to a longitudinal direction (e.g., y-direction) of the gap $G_{D2D}$. The dummy bars 500 may have a short side having a length L2 parallel to the longitudinal direction of the gap $G_{D2D}$. A width D1 of the gap $G_{D2D}$ may be in a range from 1 μm to 5000 μm (e.g., about 100 μm), but wider or narrower widths D1 are within the contemplated scope of disclosure. The dummy bars 500 may have a long side perpendicular to a longitudinal direction (e.g., y-direction) of the gap $G_{D2D}$ and a short side parallel to the longitudinal direction of the gap $G_{D2D}$. The long side of the dummy bars 500 may have a length L1 in a range from 1 mm to 30 mm (e.g., about 6 mm), and the short side of the dummy bars 500 may have a length L2 in a range from 0.1 mm to 10.0 mm (e.g., about 1.2 mm). Other ranges of L1 and L2 are within the contemplated scope of disclosure. A dummy bar 500 with a large size (e.g., large length L1) may provide better performance with various lengths D1 of the gap $G_{D2D}$ between the dies 141, 142 in the upper module portion 30. In particular, a large size of the dummy bar 500 may be good for bending strength improvement.

The lower module portion 20 may have a substantially rectangular shape in the plan view. The lower module portion 20 may have a long side perpendicular to the longitudinal direction of the gap $G_{D2D}$ and a short side parallel to the longitudinal direction of the gap $G_{D2D}$. The long side of the lower module portion 20 may have a length L3 in a range from 10 mm to 1000 mm (e.g., about 45 mm), and the short side of the lower module portion 20 may have a length L4 in a range from 5 mm to 500 mm (e.g., about 23 mm). A ratio of the length L3 of the lower module portion 20 to the length L1 of the dummy bar 500 may be in a range from 1.5 to 15. Other ranges of L3 and L4 are within the contemplated scope of disclosure.

A distance D2 (e.g., in the y-direction) between the dies 141, 142 and the edge of the lower module portion 20 may be in a range from 0.1 mm to 10 mm (e.g., about 1.74 mm). A ratio of the distance D2 to the length L2 of the dummy bar 500 may be in a range from 1.5 to 5. A distance D3 (e.g., in the x-direction) between the dies 141, 142 (collectively dies 140) and the edge of the lower module portion 20 may be in a range from 100 μm to 1000 μm (e.g., about 280 μm). A distance D4 (e.g., in the y-direction) between the dummy bar 500 and the dies 140 may be in a range from 0.1 mm to 5 mm. The distance D4 may be configured to be as small as possible so that a size of the dummy bar 500 may be as large as possible. The distance D5 (e.g., in the y-direction) between the dummy bar 500 and the edge of the lower module portion 20 may also be in a range from 0.1 mm to 5 mm. In at least one embodiment, the distance D5 may be greater than the distance D4. The distance D4 and distance D5 may depend on a die pick and place (PNP) accuracy (e.g., PNP capability to handle a higher aspect ratio die). Other ranges of D2 to D5 are within the contemplated scope of disclosure.

In at least one embodiment, the dummy bar 500 may be centered (e.g., in the x-direction) on the gap $G_{D2D}$ (e.g., a center of the dummy bar 500 in the x-direction may be substantially aligned with a center of the gap $G_{D2D}$ in the x-direction). The dummy bar 500 may provide better bending strength improvement when centered on the gap $G_{D2D}$. The dummy bar 500 may be centered on the gap $G_{D2D}$ regardless of whether the package module 120 includes dies 140 of the same length in the x-direction or different lengths in the x-direction.

Referring to FIG. 1C, the RDL portion 10 is not necessarily limited to any particular materials or configuration. The RDL portion 10 may include, for example, organic material (e.g., dielectric polymer), inorganic material (e.g., silicon), glass substrate, etc. In at least one embodiment, the RDL portion 10 may include a plurality of polymer layers 12 and a plurality of redistribution layers 12_a_ stacked alternately. The number of the polymer layers 12 and/or the number of redistribution layers 12*a* in the RDL portion 10 are not limited by the disclosure.

In at least one embodiment, the polymer layers 12 may include, for example, polyimide (PI), epoxy resin, acrylic resin, phenol resin, benzocyclobutene (BCB), polybenzoxazole (PBO), or any other suitable polymer-based dielectric material. In some embodiments, the redistribution layers 12*a* may include conductive materials. The conductive materials may include metal such as copper, aluminum, nickel, titanium, a combination thereof or other suitable metals.

The redistribution layers 12*a* may include metallic connection structures, i.e., metallic structures that provide electrical connection between nodes in the structure. The redistribution layers 12*a* may include a metallic seed layer and a metallic fill material on the metallic seed layer. The metallic seed layer may include, for example, a stack of a titanium barrier layer and a copper seed layer. The titanium barrier layer may have thickness in a range from 50 nm to 500 nm, and the copper seed layer may have a thickness in a range from 50 nm to 500 nm. The metallic fill material for the redistribution layers 12*a* may include copper, nickel, or copper and nickel. Other suitable metallic fill materials are within the contemplated scope of disclosure. The thickness of the metallic fill material that is deposited for each redistribution layer 12*a* may be in a range from 2 microns to 40 microns, such as from 4 microns to 10 microns, although lesser or greater thicknesses may also be used.

In at least one embodiment, the redistribution layers 12*a* may include a plurality of traces (lines) and a plurality of vias connecting the plurality traces to each other. The traces may be respectively located on the polymer layers 12, and may extend in the x-direction (first horizontal direction) and y-direction (second horizontal direction) on an upper surface of the polymer layers 12.

A chip-side passivation layer (not shown) may be formed on a chip-side surface of the RDL portion 10. The chip-side passivation layer may include silicon oxide, silicon nitride, low-k dielectric materials such as carbon-doped oxides, extremely low-k dielectric materials such as porous carbon doped silicon dioxide, a combination thereof or other suitable material.

One or more chip-side bonding pads (not shown) may be formed in the chip-side passivation layer on the chip-side surface of RDL portion 10. The chip-side passivation layer may at least partially cover the chip-side bonding pads. That is, the chip-side bonding pads may be at least partially exposed on the chip-side surface of the RDL portion 10. The chip-side bonding pads may be connected to the redistribution layers 12*a*. The chip-side bonding pads may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

A board-side passivation layer 14 may be formed on the board-side surface of the RDL portion 10. The board-side passivation layer 14 may also include silicon oxide, silicon nitride, low-k dielectric materials such as carbon-doped oxides, extremely low-k dielectric materials such as porous carbon doped silicon dioxide, a combination thereof or other suitable material. One or more board-side bonding pads 14*a* may be located on the board-side surface of RDL portion 10. The board-side bonding pads 14*a* may be bonded to and electrically connected to the redistribution layers 12*a*. The board-side bonding pads 14*a* may be located in the board-side passivation layer 14. The board-side passivation layer 14 may at least partially cover the board-side bonding pads 14*a*. That is, the board-side bonding pads 14*a* may be at least partially exposed on the board-side surface of the RDL portion 10. The board-side bonding pads 14*a* may also include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

One or more integrated passive devices (IPDs) (not shown) may also be located on the board-side surface of RDL portion 10. The IPDs may be bonded to and electrically connected to the redistribution layers 12*a*. The IPDs may be located in the board-side passivation layer 14. The IPDs may include an exposed portion that projects out from the board-side passivation layer 14. The IPDs may include one or more electronic components such as resistors, capacitors, inductors, coils, chokes, microstriplines, impedance matching elements, baluns, etc. The IPDs may be electrically coupled to the dies 140 through the RDL portion 10.

As further illustrated in FIG. 1C, a plurality of C4 bumps 121 may be connected to the board-side bonding pads 14*a* on the board-side surface of the RDL portion 10, respectively. In at least one embodiment, the C4 bumps 121 may include underbump metallurgy (UBM) layers on the board-side bonding pads 14*a*. The C4 bumps 121 may further include a contact pad 121*a* (e.g., copper/nickel contact pad) on the UBM layers and a solder bump 121*b* (e.g., SnAg solder bump) on the contact pad 121*a*. The C4 bumps 121 may allow the package module 120 may be connected to a substrate such as a package substrate.

The lower module portion 20 may have a length in the x-direction that is substantially the same as a length in the x-direction of the RDL portion 10 (see FIG. 1C). The lower module portion 20 may have a width in the y-direction that is substantially the same as a width in the y-direction of the RDL portion 10. The lower module portion 20 may have a thickness in the z-direction greater than a thickness of the RDL portion 10.

The lower module portion 20 may include a lower molding layer 227 (e.g., encapsulation layer) formed on the RDL portion 10. In at least one embodiment, the lower molding layer 227 may be formed of a curable material that may cure to form a hard, solid structure. The lower molding layer 227 may include, for example, epoxy molding compound (EMC). In at least one embodiment, the lower molding layer 227 may include a polymeric material and in particular, an epoxy-based polymeric material. Other suitable molding materials may be used.

In at least one embodiment, the lower molding layer 227 may have a CTE that is substantially similar to a CTE of the RDL portion 10. In at least one embodiment, the lower molding layer 227 may include an added material (e.g., filler material) for improving a property of the lower molding layer 227 (e.g., thermal conductivity, CTE, etc.). The added material may include, for example, metal powder, metal oxide powder, etc. Other materials in the lower molding layer 227 are within the contemplated scope of the disclosure.

The lower module portion 20 may also include one or more local silicon interconnect (LSI) dies 200. A package module underfill layer 229 may be formed around the LSI die 200. The package module underfill layer 229 may be formed of an epoxy-based polymeric material. The lower molding layer 227 may be formed around the LSI die 200 and the package module underfill layer 229 in the x-direction and y-direction. In at least one embodiment, the LSI die 200 and the package module underfill layer 229 may be substantially embedded in the lower molding layer 227.

The LSI die 200 may be connected to the RDL portion 10 (e.g., by an oxide-oxide bond, a metal-metal bond, etc.). The LSI die 200 may include one or more through vias 202 bonded to the chip-side bonding pads (not shown) and/or the redistribution layers 12*a* in the RDL portion 10. The LSI die 200 may therefore be electrically coupled to the RDL portion 10.

The LSI die 200 may include one or more metal traces and metal vias (not shown) as interconnect structures for interconnecting the dies 140 in the package module 120. In particular, the LSI die 200 may include one or more interconnect structures for connecting the first die 141 to the second die 142. In at least one embodiment, the interconnect structures may provide a high routing density die-to-die interconnect through multiple layers of sub-micron metal (e.g., copper) lines. The interconnect structures may allow the LSI die 200 to accommodate a plurality of different connection architectures (e.g., SoC to SoC, SoC to chiplet, SoC to HBM, etc.). The interconnect structures may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

The lower module portion 20 may also integrate additional elements, such as a stand-alone IPDs (not shown). In at least one embodiment, the IPDs may be located in the lower molding layer 227 underneath one or more of the dies 140 to support signal communication.

The lower module portion 20 may also include one or more through vias 206 (e.g., through molding vias (TMV)) in the lower molding layer 227. The through vias 206 may provide a direct coupling between the RDL portion 10 and the dies 140 in the upper module portion 30. The through vias 206 may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

The lower module portion 20 may also include one or more passivation layers 260 (e.g., oxide layer, nitride layer, etc.) on a chip-side surface of the lower module portion 20. The passivation layer 260 may be located on the lower molding layer 227 and the package module underfill layer 229. The through vias 206 may or may not extend through the passivation layer 260 and be electrically coupled to the dies 140 in the upper module portion 30.

The lower module portion 20 may also include bonding pads 255 in the lower molding layer 227. The lower module portion 20 may also include a conductive connector 55 in the passivation layer 260 and connected to the bonding pads 255. The conductive connector 55 may be connected to a die bonding pad 155 on the semiconductor dies 140. The bonding pads 255, conductive connector 55 and die bonding pad 155 may together constitute a connection structure 275 for electrically connecting the dies 140 to the lower module portion 20. Each of the bonding pads 255, conductive connector 55 and die bonding pad 155 may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

The lower module portion 20 may also include one or more microbumps 228 on a chip-side surface of the LSI die 200. The microbumps 228 may be connected to the through vias 202 in the LSI die 200. One or more of the connection structures 275 in the passivation layer 260 may be connected to the microbumps 228, allowing the dies 140 in the upper module portion 30 to be electrically coupled to the LSI die 200.

The microbumps 228 may each include a copper post and a solder bump on the copper post. The microbumps 228 may be bonded (e.g., by the solder bump) to metal contacts on the chip-side surface of the LSI die 200. The package module underfill layer 229 may be formed around the microbumps 228.

The upper module portion 30 may have a length in the x-direction that is substantially the same as a length in the x-direction of the lower module portion 20. The upper module portion 30 may have a width in the y-direction that is substantially the same as a width in the y-direction of the lower module portion 20. The upper module portion 30 may have a thickness $T_{30}$ in the z-direction greater than a thickness $T_{20}$ of the lower module portion 20.

The upper module portion 30 may include the dies 140 attached to the chip-side surface of the lower module portion 20. In particular, the dies 140 may be attached to the passivation layer 260 on the chip-side surface of the lower module portion 20. Generally, a thickness in the z-direction of each of the dies 140 may be substantially the same. Thus, the upper surfaces of each of the first die 141 and second die 142 may be substantially coplanar (e.g., formed in the same x-y plane), and referred to collectively as the die upper surface 140*a*. The dies 140 may be attached to the lower module portion 20 such that a center of the gap $G_{D2D}$ in the x-direction may be substantially aligned with a center of the LSI die 200 in the x-direction.

Each of the dies 140 may include, for example, a singular die, a system on chip (SOC) die, or a system on integrated chips (SoIC) die, and may be implemented by chip-on-wafer-on-substrate technology or integrated fan-out on substrate technology. In particular, each of the dies 140 may include, for example, a semiconductor chip or chiplet for a high performance computing (HPC) application, an artificial intelligence (AI) application, and a 5G cellular network application, a logic die (e.g., mobile application processor, microcontroller, etc.), or a memory die (e.g., high-bandwidth memory (HBM) die, hybrid memory cube (HMC), dynamic random access memory (DRAM) die, a Wide I/O die, a M-RAM die, a R-RAM die, a NAND die, static random access memory (SRAM), etc.), a central processing unit (CPU) chip, graphics processing unit (GPU) chip, field-programmable gate array (FPGA) chip, networking chip, application-specific integrated circuit (ASIC) chip, artificial intelligence/deep neural network (AI/DNN) accelerator chip, etc., a co-processor, accelerator, an on-chip memory buffer, a high data rate transceiver die, a I/O interface die, an IPD die, a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), a monolithic 3D heterogeneous chiplet stacking die, etc. Other dies are within the contemplated scope of this disclosure.

In at least one embodiment, each of the first die 141 and second die 142 may include a primary die (e.g., SOC die). In at least one embodiment, at least one of the dies 140 may include a primary die (e.g., SOC die), and at least one of the dies 140 may include an ancillary die (e.g, memory/SOC die, HBM die, etc.).

The encapsulant layer 127 may be formed around the dies 140 and the dummy bar 500 (see FIG. 1A) and have an outer sidewall that is substantially aligned with the outer sidewall of the lower module portion 20 and the RDL portion 10. The encapsulant layer 127 may also have an upper surface that is substantially uniform (e.g., flat) and substantially coplanar with the upper surface 140*a* of the dies 140. The encapsulant layer 127 may be formed on sidewalls (inner sidewall and outer sidewall) of each of the dies 140. The encapsulant layer 127 may be bonded to the sidewalls of each of the dies 140, to the passivation layer 260 and to the lower molding layer 227.

In at least one embodiment, the encapsulant layer 127 may be formed of a curable material that may cure to form a hard, solid structure. The encapsulant layer 127 may include, for example, epoxy molding compound (EMC). In at least one embodiment, the encapsulant layer 127 may include a material that is substantially similar to the package module underfill layer 229, and/or substantially similar to the lower molding layer 227 in the lower module portion 20. In at least one embodiment, the encapsulant layer 127 may include a polymeric material and in particular, an epoxy-based polymeric material. Other suitable molding materials may be used.

In at least one embodiment, the encapsulant layer 127 may have a CTE that is substantially similar to a CTE of the lower module portion 20 and/or a CTE of the RDL portion 10. In at least one embodiment, the encapsulant layer 127 may include an added material (e.g., filler material) for improving a property of the encapsulant layer 127 (e.g., thermal conductivity, CTE, etc.). The added material may include, for example, metal powder, metal oxide powder, etc. Other materials in the encapsulant layer 127 are within the contemplated scope of the disclosure.

Referring to FIG. 1D, the dummy bar 500 may be located in the encapsulant layer 127 near an edge of the lower module portion 20 (e.g., see FIG. 1B). Thus, as illustrated in FIG. 1D, the upper module portion 30 and lower module portion 20 may include little or no functional elements around the dummy bar 500. The upper surface of the dummy bar 500 may be exposed at the upper surface of the encapsulant layer 127. However, in at least one embodiment, the dummy bar 500 may be substantially surrounded on all sides by (e.g., embedded in) the encapsulant layer 127. In at least one embodiment, the encapsulant layer 127 may be bonded to all sides of the dummy bar 500. In at least one embodiment, the dummy bar 500 may be attached to the upper surface of the lower module portion 20 by an adhesive layer (e.g., silicone adhesive, epoxy adhesive, etc.).

The dummy bar 500 may be non-functional, and may be formed of a variety of materials such as silicon, silica, glass, ceramic materials, metal materials, etc. Other suitable materials may be used for the dummy bar 500. In at least one embodiment, the dummy bar 500 may have a CTE substantially the same as the encapsulant layer 127. The dummy bar 500 may be added, for example, to provide structural stability.

Figure 2A:
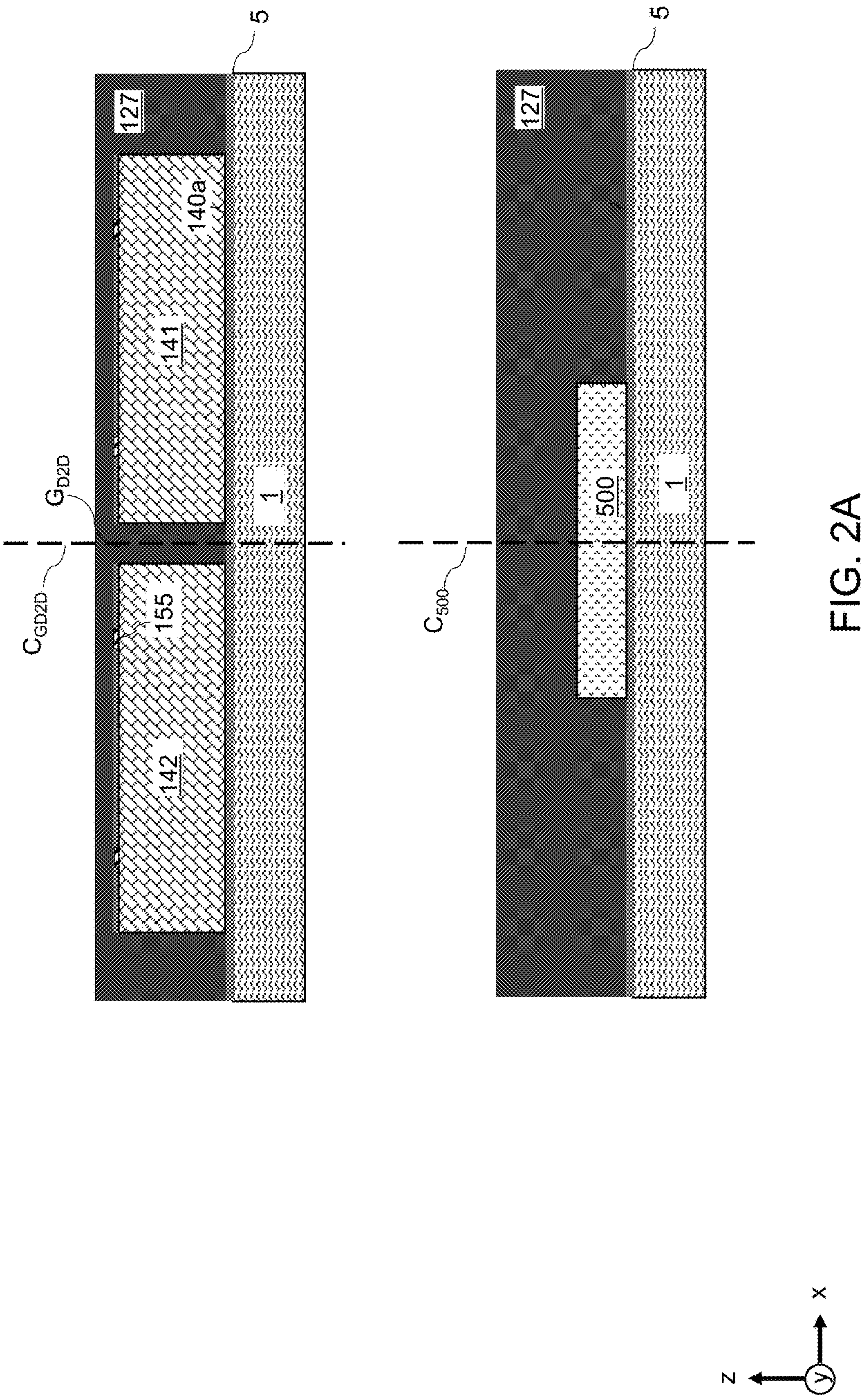
FIG. 2A provides two vertical cross-sectional views of an intermediate structure including the dummy bar, the first die and the second die attached to a first carrier substrate (e.g., carrier wafer) according to an embodiment of the present invention.

FIGS. 2A-2H illustrate various intermediate structures in a method of forming the package module 120 according to one or more embodiments. FIG. 2A provides two vertical cross-sectional views of an intermediate structure including the dummy bar 500, the first die 141 and the second die 142 attached to a first carrier substrate 1 (e.g., carrier wafer), according to an embodiment of the present invention.

The first carrier substrate 1 may include a circular wafer or a rectangular wafer. The lateral dimensions (such as the diameter of a circular wafer or a side of a rectangular wafer) of the first carrier substrate 1 may be in a range from 100 mm to 500 mm, such as from 200 mm to 400 mm, although lesser and greater lateral dimensions may also be used. The first carrier substrate 1 may include a semiconductor substrate, an insulating substrate, or a conductive substrate. The first carrier substrate 1 may be transparent or opaque. A thickness of the first carrier substrate 1 may be sufficient to provide mechanical support to an array of interposers to be formed thereupon. For example, the thickness of the first carrier substrate 1 may be in a range from 60 microns to 1 mm, although lesser and greater thicknesses may also be used.

An adhesive layer 5 may be applied to the top surface of the first carrier substrate 1. In one embodiment, the first carrier substrate 1 may include an optically transparent material such as glass or sapphire. In this embodiment, the adhesive layer 5 may include a light-to-heat conversion (LTHC) layer. The LTHC layer is a solvent-based coating applied using a spin coating method. The LTHC layer may form a layer that converts ultraviolet light to heat such that the LTHC layer loses adhesion. Alternatively, the adhesive layer 5 may include a thermally decomposing adhesive material. For example, the adhesive layer 5 may include an acrylic pressure-sensitive adhesive that decomposes at an elevated temperature. The debonding temperature of the thermally decomposing adhesive material may be in a range from 150° C. to 400° C. Other suitable thermally decomposing adhesive materials that decompose at other temperatures are within the contemplated scope of disclosure.

As illustrated in the upper portion of FIG. 2A, the first die 141 and second die 142 may be placed on the adhesive layer 5 by an electromechanical pick and place (PNP) machine. The first die 141 and second die 142 may placed on the adhesive layer in an inverted orientation. That is, a bulk semiconductor portion of the first die 141 and second die 142 may be attached to the adhesive layer 5. An active region of the first die 141 and second die 142 which is opposite the bulk semiconductor portion and connected to the die bonding pad 155 may be located away from the adhesive layer 5.

As illustrated in the lower portion of FIG. 2A, the dummy bar 500 may also be placed on the adhesive layer 5 by an electromechanical pick and place (PNP) machine. The dummy bar 500 may be placed on the adhesive layer 5 such that the dummy bar 500 is between the first die 141 and the second die 142 and an edge of the subsequently formed encapsulant layer 127 in the y-direction. Further, the dummy bar 500 may be placed on the adhesive layer 5 such that the dummy bar 500 is adjacent the gap $G_{D2D}$ in the y-direction. In particular, the dummy bar 500 may be placed on the adhesive layer 5 such that a centerpoint $C_{500}$ of the dummy bar 500 in the x-direction is substantially aligned with a centerpoint $C_{GD2D}$ of the gap $G_{D2D}$ in the x-direction. It should be noted that the dummy bar 500 may be placed on the adhesive layer before or after placing the first die 141 and second die 142 on the adhesive layer 5.

After the first die 141, the second die 142 and the dummy bar 500 are placed on the adhesive layer 5, an encapsulant material (epoxy polymer material (e.g., epoxy molding compound (EMC)) for forming the encapsulant layer 127 may be deposited. The encapsulant layer 127 may be formed by performing over-molding process and subsequently performing a grinding (e.g., planarization) process.

In particular, the encapsulant material may deposited by a suitable deposition process over the first die 141, the second die 142 and the dummy bar 500 on the adhesive layer 5. The encapsulant material may be deposited over and around the first die 141, the second die 142 and the dummy bar 500 so as to fill in the gaps between the first die 141, the second die 142 and the dummy bar 500. The encapsulant material may encapsulate (e.g., in the x-direction and y-direction) the first die 141, the second die 142 and the dummy bar 500. In particular, the encapsulant material may fill the gap $G_{D2D}$ between the first die 141, the second die 142.

The encapsulant material for the encapsulant layer 127 may be deposited, for example, by a deposition process such as chemical vapor deposition (CVD), plasma enhanced CVD (PECVD), physical vapor deposition (PVD), spin coating, lamination or other suitable deposition technique. After the encapsulant material is deposited, encapsulant material may be cured, for example, in a box oven for about 90 minutes at about 150° C. to form the encapsulant layer 127 with a sufficient stiffness and mechanical strength.

FIG. 2B is a vertical cross-sectional view of an intermediate structure after grinding of the encapsulant layer 127, according to one or more embodiments. After the encapsulant layer 127 has cured, a grinding process may then be performed to reduce a height of an upper surface of the encapsulant layer 127. In particular, the planarization process may be performed on the upper surface of the encapsulant layer 127 until an upper surface of the die bonding pads 155 are exposed through the encapsulant layer 127. The grinding process may include, for example, a mechanical grinding process and/or a chemical mechanical polishing (CMP) process.

Figure 2C:
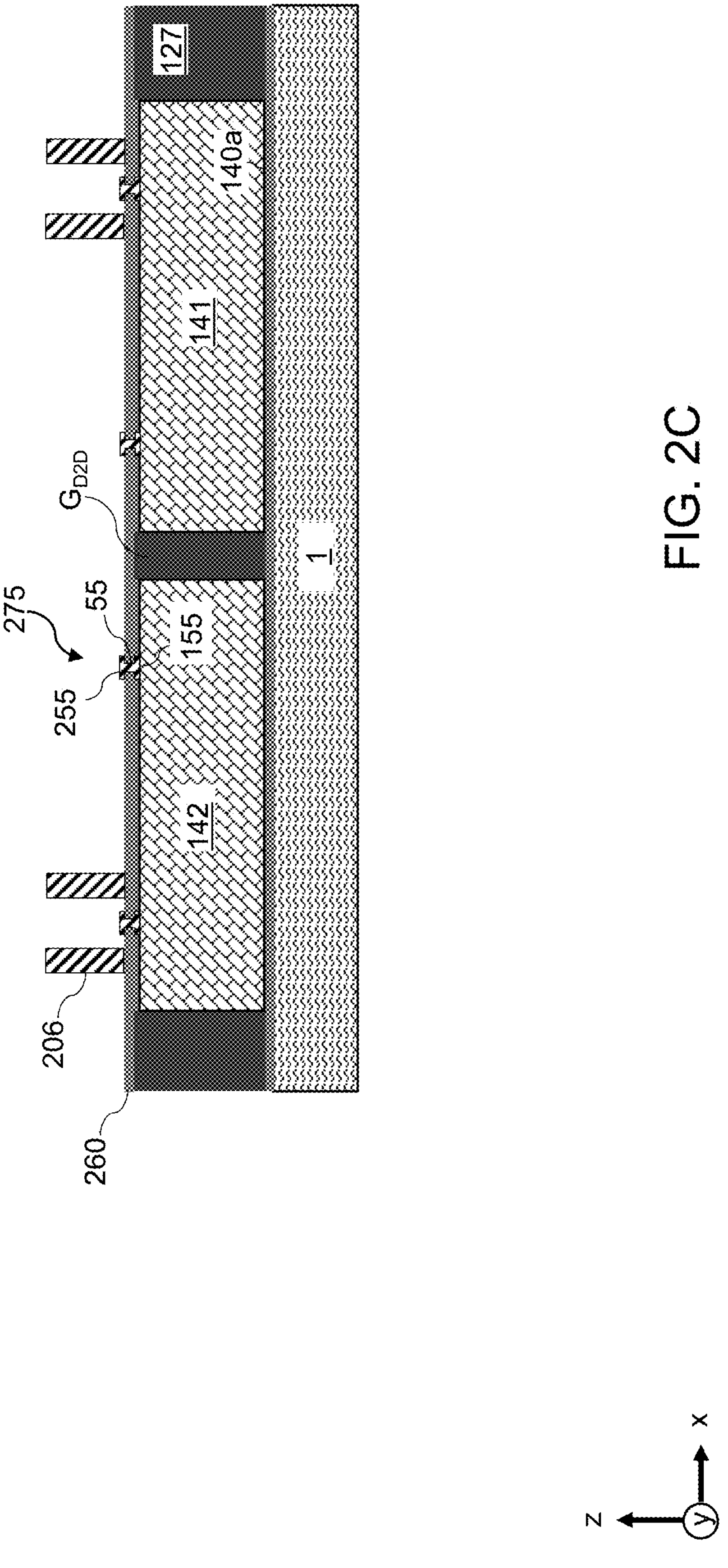
FIG. 2C is a vertical cross-sectional view of an intermediate structure after forming the passivation layer, the connection structures and the through vias, according to one or more embodiments.

FIG. 2C is a vertical cross-sectional view of an intermediate structure after forming the passivation layer 260, the connection structures 275 and the through vias 206, according to one or more embodiments. The passivation layer 260 may be deposited on the first die 141, the second die 142 and the encapsulant layer 127. The passivation layer 260 may be deposited, for example, by a deposition process such as chemical vapor deposition (CVD), plasma enhanced CVD (PECVD), physical vapor deposition (PVD), spin coating, lamination or other suitable deposition technique.

After the passivation layer 260 has cured, a photolithographic process may be performed in order to form the conductive connector 55 and the bonding pad 255. The photolithographic process may include forming a patterned photoresist mask (not shown) on the passivation layer 260, and etching (e.g., wet etching, dry etching, etc.) the exposed upper surface of the passivation layer 260 through openings in the photoresist mask. The photoresist mask may be subsequently removed by ashing, dissolving the photoresist mask or by consuming the photoresist mask during the etch process.

One or more metal layers including a metal, metal alloys, and/or other metal-containing compounds (e.g., Cu, Al, Mo, Co, Ru, W, TiN, TaN, WN, etc.) may then be deposited on the passivation layer 260. In particular, the metal layer may be formed in the openings in the passivation layer 260 to form the conductive connectors 55. The metal layer may then be patterned by a photolithographic process so as to form the bonding pads 255. The photolithographic process may include forming a patterned photoresist mask (not shown) on the metallic material, and etching (e.g., wet etching, dry etching, etc.) the exposed upper surface of the metallic material through openings in the photoresist mask to form the bonding pads 255. The photoresist mask may be subsequently removed by ashing, dissolving the photoresist mask or by consuming the photoresist mask during the etch process.

In at least one embodiment, the bonding pads 255 may include underbump metallurgy (UBM) layer stack. The UBM layer stack may be formed, for example, by depositing (by suitable deposition process) a metal layer stack such as Cr/Cr-Cu/Cu/Au, Cr/Cr-Cu/Cu, TiW/Cr/Cu, Ti/Ni/Au, and Cr/Cu/Au. Other suitable materials are within the contemplated scope of disclosure. The thickness of the UBM layer stack may be in a range from 5 microns to 60 microns, such as from 10 microns to 30 microns, although lesser and greater thicknesses may also be used.

The through vias 260 (e.g., through molding vias (TMV)) may then be formed, for example, by an electroplating process (e.g., copper electroplating process). In at least one embodiment, the electroplating process may form metal pillars (e.g., copper pillars) on the UBM layer stack. The electroplating process may be performed at least until the metal pillars (e.g., copper pillars) formed by the electroplating process have a height greater than an ultimate height of the through vias 260.

FIG. 2D is a vertical cross-sectional view of an intermediate structure including the LSI die 200 according to one or more embodiments. The LSI die 200 may be placed on the passivation layer 260, for example, using an electromechanical pick-and-place (PNP) machine. The LSI die 200 may be connected to the connection structures 275 on the first die 141 and the second die 142 by microbumps 228 (e.g., microbump joint).

In at least one embodiment, the microbumps 228 may include a two-dimensional array of microbumps 228, and the LSI die 200 may be connected to each of the first die 141 and the second die 142 by chip connection (C2) bonding, (e.g., solder bonding). A C2 bonding process that reflows the solder portions of the microbumps 228 may be performed after the microbumps 228 on the LSI die 200 are disposed over corresponding die bonding pads 155 in the first die 141 and second die 142. The LSI die 200 may alternatively be mounted on the first die 141 and second die 142 by a hybrid bonding process (e.g., metal-metal bonding, oxide-oxide bonding). It should be noted that the LSI die 200 may be mounted on the RDL portion 10 before or after the forming of the through vias 206.

The package module underfill layer 229 may then be applied by depositing and/or injecting an epoxy-based polymeric material onto the passivation layer 260. The epoxy-based polymeric material may be applied on the passivation layer 260 so as to be formed under the LSI die 200 and around the microbumps 228. In at least one embodiment, the epoxy-based polymeric material may fill substantially all of the gaps between the LSI die 200 and the passivation layer 260. The epoxy-based polymeric material may then be cured, for example, in a box oven for about 90 minutes at about 150° C. to form the package module underfill layer 229 with a sufficient stiffness and mechanical strength.

FIG. 2E is a vertical cross-sectional view of an intermediate structure after thinning the LSI die 200, according to one or more embodiments. The LSI die 200 may be thinned, for example, by performing a mechanical grinding process (and/or a chemical mechanical polishing (CMP) process) on an upper surface (e.g., a bulk semiconductor surface) of the LSI die 200). After the grinding process, a height of the upper surface of the LSI die 200 may remain above a height of an upper surface of the through vias 206. Other suitable thinning techniques are within the contemplated scope of disclosure.

FIG. 2F is a vertical cross-sectional view of an intermediate structure including the lower molding layer 227 according to one or more embodiments. The lower molding layer 227 may be formed in a manner substantially similar to the manner of forming the encapsulant layer 127 described above (e.g., see FIG. 2A and related text). As illustrated in FIG. 2F, the lower molding layer 227 may be formed by performing an over-molding process followed by a planarization process. In particular, the lower molding layer 227 may include an epoxy polymer material (e.g., an epoxy molding compound (EMC). The lower molding layer 227 may be deposited on the passivation layer 260 and fill in the gaps between the LSI die 200 and the through vias 206. The lower molding layer 227 may encapsulate (e.g., in the x-direction and y-direction) the LSI die 200 and the through vias 206. The molding material for the lower molding layer 227 may be deposited, for example, by a deposition process such as chemical vapor deposition (CVD), plasma enhanced CVD (PECVD), physical vapor deposition (PVD), spin coating, lamination or other suitable deposition technique.

The lower molding layer 227 may be deposited so as to completely cover the LSI die 200 and the through vias 206. After the lower molding layer 227 has cured, a planarization process (e.g., chemical mechanical planarization/polishing (CMP)) may then be used to make an upper surface of the lower molding layer 227 coplanar with an upper surface of the LSI die 200 and an upper surface of the through vias 206. In particular, the planarization process may be performed on the upper surface of the lower molding layer 227 until an upper surface of the LSI die 200 and an upper surface of the through vias 206 are exposed through the lower molding layer 227. The planarization process may include, for example, a mechanical grinding process and/or a CMP process.

FIG. 2G is a vertical cross-sectional view of an intermediate structure including the RDL portion 10 and C4 bumps 121, according to one or more embodiments. The RDL portion 10 may be formed by alternately forming the plurality of dielectric layers 12 and plurality of redistribution layers 12*a* on the planarized surface of the lower molding layer 227 and on the upper surface of the LSI die 200. It should be noted that although FIG. 2G illustrates three dielectric layers 12 and three redistribution layers 12*a*, more or fewer dielectric layers 12 and redistribution layers 12*a* are within the contemplated scope of disclosure.

Each dielectric layer 12 may each be formed, for example, by depositing (e.g., by CVD, PVD or other suitable deposition technique) a layer of dielectric polymer material such as polyimide (PI), benzocyclobutene (BCB), or polybenzobisoxazole (PBO). Other suitable materials are within the contemplated scope of disclosure. The thickness of the layer of dielectric polymer material may be in a range from 4 microns to 60 microns, although lesser and greater thicknesses may also be used. The dielectric layer 12 may then be patterned by a photolithographic process to form via holes in the dielectric layer 12. The photolithographic process may include forming a patterned photoresist mask (not shown) on the layer of dielectric material, and etching (e.g., wet etching, dry etching, etc.) the exposed upper surface of the dielectric material through openings in the photoresist mask. The photoresist mask may be subsequently removed by ashing, dissolving the photoresist mask or by consuming the photoresist mask during the etch process.

A redistribution layer 12*a* (e.g., metal traces and metal vias) may then be formed on the dielectric layer 12. The redistribution layer 12*a* may be formed, for example, by depositing (e.g., by CVD, PVD or other suitable deposition technique) one or more layers of metal material such as copper, aluminum, nickel, titanium, a combination thereof or other suitable metals, on the dielectric layer 12 and in the vias holes formed by patterning the dielectric layer 12. The redistribution layer 12*a* may then be patterned by a photolithographic process. The photolithographic process may include forming a patterned photoresist mask (not shown) on the layer of metal material, and etching (e.g., wet etching, dry etching, etc.) the exposed upper surface of the metal material through openings in the photoresist mask. The photoresist mask may be subsequently removed by ashing, dissolving the photoresist mask or by consuming the photoresist mask during the etch process.

The board-side bonding pads 14*a* may then be formed on the uppermost dielectric layer 12. The board-side bonding pads 14*a* may be formed by depositing (e.g., by CVD, PVD or other suitable deposition technique) one or more metal layers including a metal, metal alloys, and/or other metal-containing compounds (e.g., Cu, Al, Mo, Co, Ru, W, TiN, TaN, WN, etc.). The metal layer may then be patterned by a photolithographic process so as to form the board-side bonding pads 14*a*. The photolithographic process may include forming a patterned photoresist mask (not shown) on the metallic material, and etching (e.g., wet etching, dry etching, etc.) the exposed upper surface of the metallic material through openings in the photoresist mask. The photoresist mask may be subsequently removed by ashing, dissolving the photoresist mask or by consuming the photoresist mask during the etch process.

In at least one embodiment, the board-side bonding pads 14*a* may include an underbump metallurgy (UBM) layer stack. The order of material layers within the UBM layer stack may be selected such that solder material portions may be subsequently bonded to portions of the bottom surface of the UBM layer stack. Layer stacks that may be used for the UBM layer stack include, but are not limited to, stacks of Cr/Cr-Cu/Cu/Au, Cr/Cr-Cu/Cu, TiW/Cr/Cu, Ti/Ni/Au, and Cr/Cu/Au. Other suitable materials are within the contemplated scope of disclosure. The thickness of the UBM layer stack may be in a range from 5 microns to 60 microns, such as from 10 microns to 30 microns, although lesser and greater thicknesses may also be used. A photoresist layer may be applied over the UBM layer stack, and may be lithographically patterned to form an array of discrete patterned photoresist material portions. An etch process may be performed to remove unmasked portions of the UBM layer stack. The etch process may be an isotropic etch process or an anisotropic etch process. Remaining portions of the UBM layer stack may form the board-side bonding pads 14*a*. In at least one embodiment, the board-side bonding pads 14*a* may be arranged as a two-dimensional array (e.g., two-dimensional periodic array) such as a rectangular periodic array.

The board-side passivation layer 14 may then be formed on the board-side surface of the RDL portion 10 and over the board-side bonding pads 14*a*. The board-side passivation layer may be formed by depositing (e.g., by CVD, PVD or other suitable deposition technique) one or more layers of passivation material including silicon oxide, silicon nitride, low-k dielectric materials such as carbon-doped oxides, extremely low-k dielectric materials such as porous carbon doped silicon dioxide, a combination thereof or other suitable material. The passivation material may then be planarized (e.g., by wet etching, drying etching, chemical mechanical polishing (CMP), etc.) so as to form the board-side passivation layer 14.

Openings may formed in the board-side passivation layer 14 (e.g., by photolithographic process). The plurality of C4 bumps 121 may then be formed on the board-side bonding pads 14*a* through the openings in the board-side passivation layer 14. The C4 bumps 121 may be formed, for example, by first forming the contact pad 121*a* (e.g., copper/nickel contact pad) on the UBM layers by an electroplating process. The solder bump 121*b* (e.g., SnAg solder bump) may then be formed on the contact pad 121*a*.

Figure 2H:
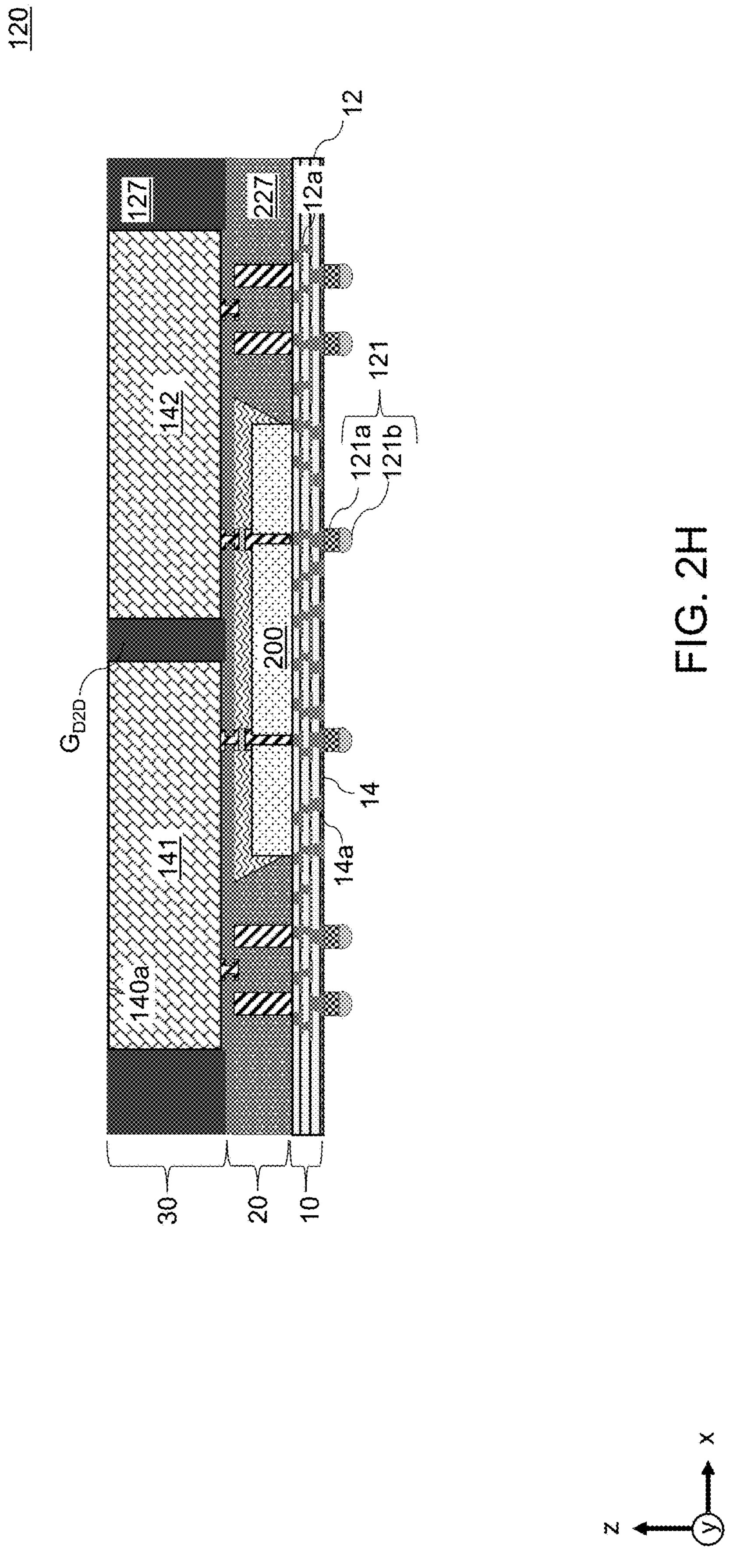
FIG. 2H is a vertical cross-sectional view of an intermediate structure after the debonding of the first carrier substrate, according to one or more embodiments.

FIG. 2H is a vertical cross-sectional view of an intermediate structure after the debonding of the first carrier substrate 1, according to one or more embodiments.

After the forming of the C4 bumps 121, the first carrier substrate 1 may be debonded from the intermediate structure. The debonding of the first carrier substrate 1 may be performed, for example, by deactivating the adhesive layer 5. The adhesive layer 5 may be deactivated, for example, by a thermal anneal at an elevated temperature (e.g., for a thermally-deactivated adhesive material) or by exposing the adhesive layer to ultraviolet light (e.g., for an ultraviolet-deactivated adhesive material).

A plurality of the package modules 120 may be formed concurrently in a wafer-level process. After the debonding of the first carrier substrate 1, a singulation process may be performed in order to singulate the package modules 120. The singulation process may be performed, for example, by using a dicing saw to saw the upper module portion 30, lower module portion 20 and RDL portion 10 along dicing lines. The dicing lines may be located around the entire periphery of the package module 120 and sufficiently distant (e.g., greater than 0.1 mm) from the dummy bars 500.

Figure 3:
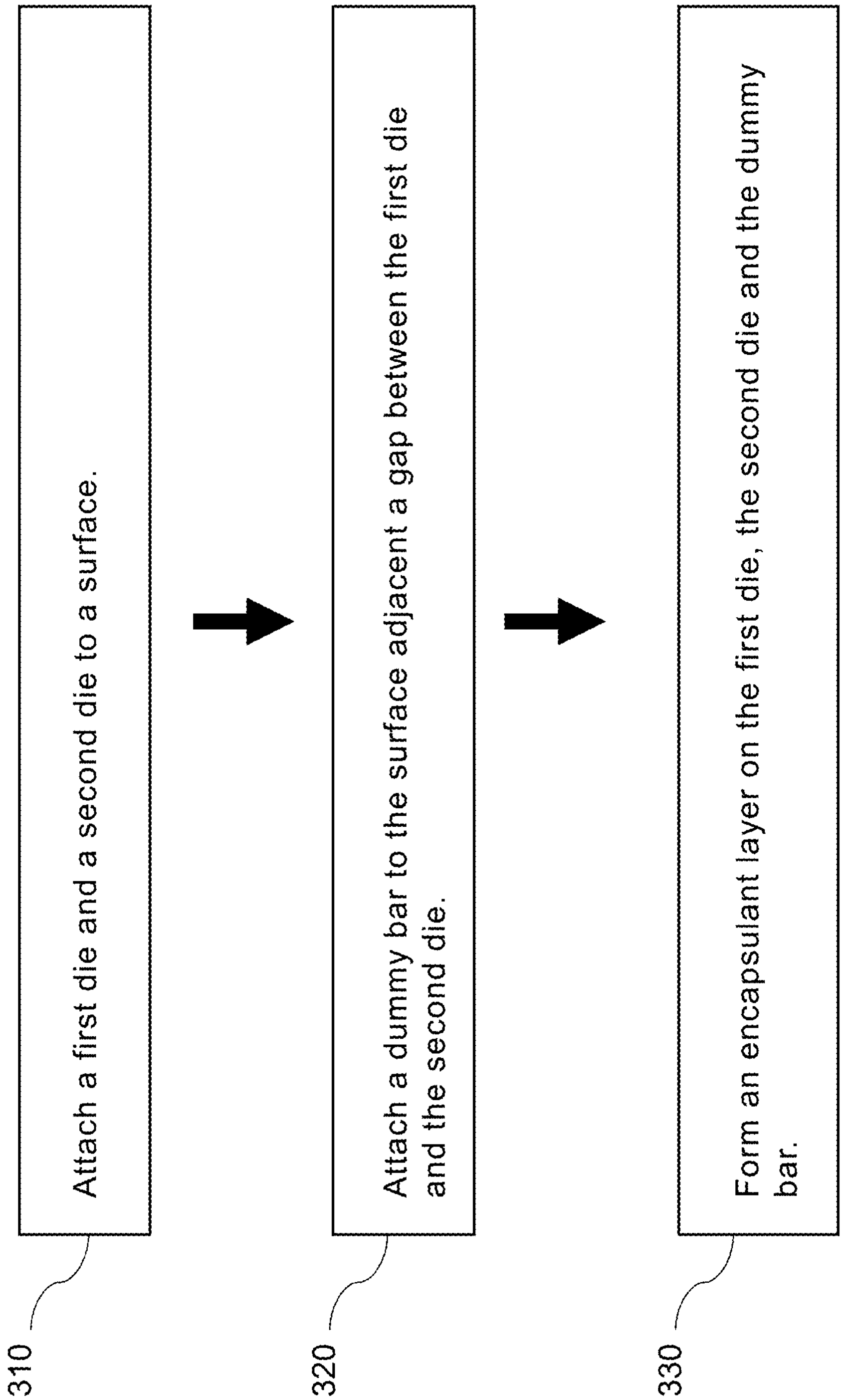
FIG. 3 is a flow chart illustrating a method of forming a package (e.g., package module) according to one or more embodiments.

FIG. 3 is a flow chart illustrating a method of forming a package (e.g., package module 120) according to one or more embodiments. Step 310 includes attaching a first die and a second die to a surface. Step 320 includes attaching a dummy bar to the surface adjacent a gap between the first die and the second die. Step 330 includes forming an encapsulant layer on the first die, the second die and the dummy bar.

Figure 4A:
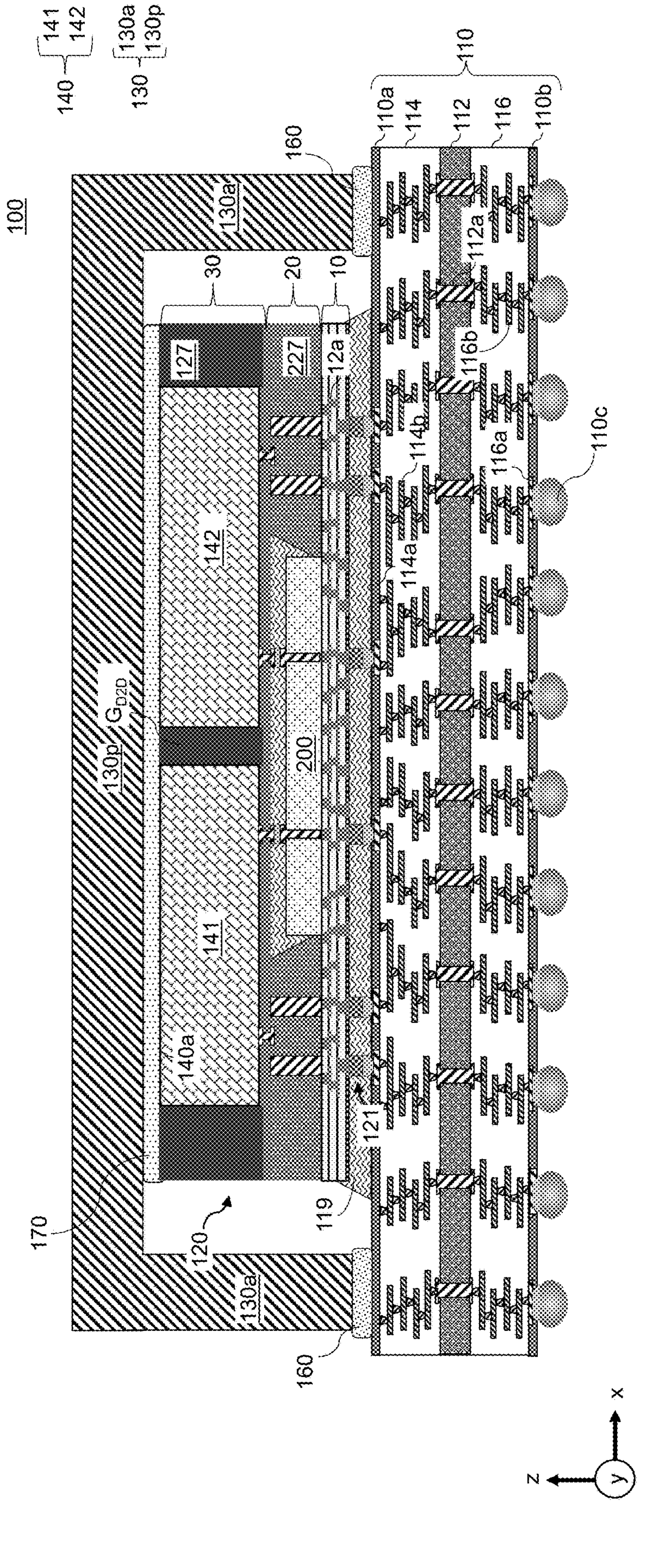
FIG. 4A is a vertical cross-sectional view of the package according to one or more embodiments.

FIGS. 4A and 4B illustrate a package 100 including the package module 120, according to one more embodiments. FIG. 4A is a vertical cross-sectional view of the package 100 according to one or more embodiments. FIG. 4B is a plan view (e.g., top-down view) of the package 100 according to one or more embodiments. The vertical cross-sectional view in FIG. 4A is along the line B-B' in FIG. 4B.

As illustrated in FIG. 4A, the package 100 may include a package substrate 110, the package module 120 on the package substrate 110, and a package lid 130 on the package module 120. The package substrate 110 may include a cored or coreless substrate. In at least one embodiment, for example, the package substrate 110 may include a core 112, a package substrate upper dielectric layer 114 formed on the core 112 (e.g., a first side or chip-side of the package substrate 110), and a package substrate lower dielectric layer 116 formed on the core 112 (e.g., a second side or board-side of the package substrate 110). In particular, the package substrate 110 may include a build-up film substrate such as an Ajinomoto build-up film (ABF) substrate. That is, in at least one embodiment, each of the package substrate upper dielectric layer 114 and the package substrate lower dielectric layer 116 may be described as an ABF layer.

The core 112 may help to provide rigidity to the package substrate 110. The core 112 may include, for example, an epoxy resin such as a bismaleimide triazine epoxy (BT epoxy) and/or a woven glass laminate. The core 112 may alternatively or in addition include an organic material such as a polymer material. In particular, the core 112 may include a dielectric polymer material such as polyimide (PI), benzocyclo-butene (BCB), or polybenzobisoxazole (PBO). Other suitable dielectric materials are within the contemplated scope of disclosure.

The core 112 may include one or more through vias 112*a*. The through vias 112*a* may extend from a lower surface of the core 112 to an upper surface of the core 112. The through vias 112*a* may allow an electrical connection between the package substrate upper dielectric layer 114 and the package substrate lower dielectric layer 116. The through vias 112*a* may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

The package substrate upper dielectric layer 114 may be formed on an upper surface of the core 112. The package substrate upper dielectric layer 114 may include a plurality of layers and, in particular, may include a build-up film (e.g., ABF). The package substrate upper dielectric layer 114 may also include an organic material such as a polymer material. In particular, the package substrate upper dielectric layer 114 may include a dielectric polymer material such as polyimide (PI), benzocyclobutene (BCB), or polybenzobisoxazole (PBO). Other suitable dielectric materials are within the contemplated scope of disclosure.

The package substrate upper dielectric layer 114 may include one or more package substrate upper bonding pads 114*a* on a chip-side surface of the package substrate upper dielectric layer 114. In particular, the package substrate upper bonding pads 114*a* may be exposed on the chip-side surface of the package substrate upper dielectric layer 114. The package substrate upper dielectric layer 114 may also include one or more metal interconnect structures 114*b*. The metal interconnect structures 114*b* may be connected to the package substrate upper bonding pads 114*a* and the through vias 112*a* in the core 112. The metal interconnect structures 114*b* may include metal layers (e.g., copper traces) and metal vias connecting the metal layers. The package substrate upper bonding pads 114*a* and the metal interconnect structures 114*b* may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

A package substrate upper passivation layer 110*a* may be formed on the chip-side surface of the package substrate upper dielectric layer 114. The package substrate upper passivation layer 110*a* may partially cover the package substrate upper bonding pads 114*a*. The upper passivation layer 110*a* may include silicon oxide, silicon nitride, low-k dielectric materials such as carbon-doped oxides, extremely low-k dielectric materials such as porous carbon doped silicon dioxide, a combination thereof or other suitable material.

The package substrate lower dielectric layer 116 may be formed on an lower surface of the core 112. The package substrate lower dielectric layer 116 may also include a plurality of layers and, in particular, may include a build-up film (e.g., ABF). The package substrate lower dielectric layer 116 may also include an organic material such as a polymer material. In particular, the package substrate lower dielectric layer 116 may include a dielectric polymer material such as polyimide (PI), benzocyclobutene (BCB), or polybenzobisoxazole (PBO). Other suitable dielectric materials are within the contemplated scope of disclosure.

The package substrate lower dielectric layer 116 may include one or more package substrate lower bonding pads 116*a* on a board-side surface of the package substrate lower dielectric layer 116. In particular, the package substrate lower bonding pads 116*a* may be exposed on the board-side surface of the package substrate lower dielectric layer 116. The package substrate lower dielectric layer 116 may also include one or more metal interconnect structures 116*b*. The metal interconnect structures 116*b* may be connected to the package substrate lower bonding pads 116*a* and the through vias 112*a* in the core 112. The metal interconnect structures 116*b* may include metal layers (e.g., copper traces) and metal vias connecting the metal layers. The package substrate lower bonding pads 116*a* and the metal interconnect structures 116*b* may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

A package substrate lower passivation layer 110*b* may be formed on the board-side surface of the package substrate lower dielectric layer 116. The package substrate lower passivation layer 110*b* may partially cover the package substrate lower bonding pads 116*a*. The package substrate lower passivation layer 110*b* may include silicon oxide, silicon nitride, low-k dielectric materials such as carbon-doped oxides, extremely low-k dielectric materials such as porous carbon doped silicon dioxide, a combination thereof or other suitable material.

A ball-grid array (BGA) including a plurality of solder balls 110*c* may be formed on the board-side surface of the package substrate lower dielectric layer 116. The solder balls 110*c* may allow the package 100 to be securely mounted on a substrate such as a printed circuit board (PCB) and electrically coupled to the PCB substrate. The solder balls 110*c* may contact the package substrate lower bonding pads 116*a*, respectively. The solder balls 110*c* may therefore be electrically connected to the package substrate upper bonding pads 114*a* by way of metal interconnect structures 116*b*, the through vias 112*a* and the metal interconnect structures 114*b*.

The package module 120 may be connected to the package substrate 110 by the C4 bumps 121 on the board-side surface of the RDL portion 10. In particular, the C4 bumps 121 may be bonded (e.g., using solder reflow, compression bonding, thermocompression bonding, etc.) to the package substrate upper bonding pads 114*a* of the package substrate 110. As illustrated in FIG. 4A, the package substrate 110 may have a length in the x-direction that is greater than a length of the package module 120 in the x-direction. The package substrate 110 may also have a width in the y-direction that is greater than a width of the package module 120 in the y-direction.

A package underfill layer 119 may be formed on the package substrate 110 under and around the package module 120. The package underfill layer 119 may also be formed around the C4 bumps 121. The package underfill layer 119 may thereby securely fix the package module 120 to the package substrate 110. The package underfill layer 119 may be substantially similar to the package module underfill layer 229 (see FIG. 1C). The package underfill layer 119 may be formed of an epoxy-based polymeric material.

The package 100 may further include a thermal interface material (TIM) layer 170 on the package module 120. The TIM layer 170 may be located on the upper surface of the encapsulant layer 127 and on the upper surface 140*a* of the dies 140. The TIM layer 170 may include, for example, a TIM paste, a gel TIM, graphite TIM, metal TIM, solder TIM and a carbon nanotube TIM. In at least one embodiment, the TIM layer 170 may include a film-type TIM layer. In at least one embodiment, the TIM layer 170 may include an indium base, silver base and/or solder base. Other types of TIMs are within the contemplated scope of this disclosure. In at least one embodiment, the TIM layer 170 may have a thickness (e.g., a greatest thickness in the z-direction) in a range from 50 μm to 500 μm.

The TIM layer 170 may be formed on the package module 120 to help dissipate heat generated during operation of the package 100 (e.g., operation of the dies 140). The TIM layer 170 may be attached to the package module 120, for example, by a thermally conductive adhesive. The TIM layer 170 may have a low bulk thermal impedance and high thermal conductivity. The bond-line-thickness (BLT) (e.g., a distance between the package lid 130 and the package module 120) may be less than about 100 μm, although greater or lesser distances may be used.

The package lid 130 may be located on the TIM layer 170 and connected to the package module 120. The package lid 130 may include a plate portion 130*p* formed on the package module 120 and a foot portion 130*a* located around an outer periphery of the plate portion 130*p*. The foot portion 130*a* may be fixed to the package substrate 110 by an adhesive layer 160. The plate portion 130*p* may contact at least a portion of the TIM layer 170. In one or more embodiments, the plate portion 130*p* may directly contact an entire upper surface of the TIM layer 170. The TIM layer 170 may be compressed between the plate portion 130*p* and the package module 120. In particular, the TIM layer 170 may be compressed between the plate portion 130*p* and the upper surface of the encapsulant layer 127 and between the plate portion 130*p* and the upper surface 140*a* of the dies 140.

The package lid 130 may be formed, for example, of metal, ceramic or polymer material. The plate portion 130*p* of the package lid 130 may have a plate shape (e.g., planar shape) and be substantially parallel to an upper surface of the package substrate 110. The plate portion 130*p* may extend, for example, in an x-y plane in FIG. 4A. The plate portion 130*p* may include an outer sidewall that is substantially aligned with an outer sidewall of the foot portion 130*a*. The plate portion 130*p* may include a central portion that is substantially aligned in the z-direction with a central portion of the package module 120. The plate portion 130*p* may include an upper surface and a bottom surface that are substantially planar. Alternatively, the plate portion 130*p* may also include a bottom step region (not shown) that may project from the bottom surface and contact the TIM layer 170.

The adhesive layer 160 may be formed on the package substrate 110 near the sidewall of the package module 120. The adhesive layer 160 may bond the foot portion 130*a* of the package lid 130 to package substrate 110. A thickness of the adhesive layer 160 may be in a range from 50 μm to 200 μm. The adhesive layer 160 may include, for example, a silicone adhesive (e.g., containing aluminum oxide, zinc oxide, resin, etc.) or an epoxy adhesive. Other suitable adhesives may be used. The adhesive layer 160 may contact the backside metal layer or the recessed upper surface of the upper molding material layer.

Referring again to FIG. 4B, the plate portion 130*p* of the package lid 130 and the TIM layer 170 have been omitted from FIG. 4B for ease of understanding. As illustrated in FIG. 4B, the package substrate 110 may have a rectangular shape in the plan view. A center of the package module 120 in the x-direction and y-direction may be substantially aligned with a center of the package substrate 110 in the x-direction and y-direction. The package substrate 110 may include a long side substantially parallel to a long side of the package module 120 and a short side substantially parallel to the short side of the package module 120.

The foot portion 130*a* of the package lid 130 may also include a long side substantially parallel to a long side of the package module 120 and a short side substantially parallel to the short side of the package module 120. The foot portion 130*a* of the package lid 130 may be attached continuously to the package substrate 110 around an entire periphery of the package module 120. In at least one embodiment, a distance D6 between the package module 120 and the foot portion 130*a* may be substantially uniform around the entire periphery of the package module 120. In at least one embodiment, a distance D7 between the foot portion 130*a* and each of the dummy bars 500 in the package module 120 may be substantially the same. The dummy bars 500 may also be located equidistant in the x-direction between opposing inner sidewalls of the foot portion 130*a*.

Figure 5A:
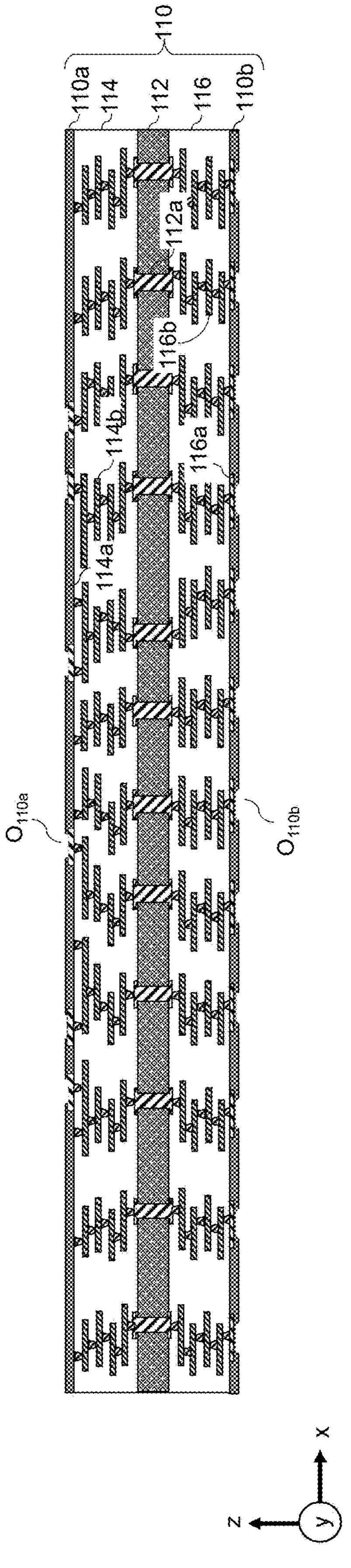
FIG. 5A is a vertical cross-sectional view of an intermediate structure including the package substrate having package substrate upper bonding pads and package substrate lower bonding pads, according to one or more embodiments.

FIGS. 5A-5G illustrate various intermediate structures in a method of forming the package 100 according to one or more embodiments. FIG. 5A is a vertical cross-sectional view of an intermediate structure including the package substrate 110 having package substrate upper bonding pads 114*a* and package substrate lower bonding pads 116*a*, according to one or more embodiments. The package substrate 110 including the core 112, the package substrate upper dielectric layer 114, and the package substrate lower dielectric layer 116 may be provided.

The package substrate upper bonding pads 114*a* may be formed, for example, on an uppermost dielectric layer of the package substrate upper dielectric layer 114. The package substrate upper bonding pads 114*a* may be formed to contact the metal interconnect structures 114*b*. The package substrate upper bonding pads 114*a* may be formed by depositing a metal layer (e.g., copper, aluminum or other suitable conductive materials) on the upper surface of the package substrate upper dielectric layer 114. The metal layer may then be patterned by etching (e.g., by wet etching, dry etching, etc.) to form the package substrate upper bonding pads 114*a*. Other suitable metal layer materials and etching processes may be within the contemplated scope of disclosure.

The package substrate lower bonding pads 116*a* may be formed, for example, on a lowest dielectric layer of the package substrate lower dielectric layer 116. The package substrate lower bonding pads 116*a* may be formed to contact the metal interconnect structures 116*b*. The package substrate lower bonding pads 116*a* may be formed in a manner similar to the manner of forming the package substrate upper bonding pads 114*a* (e.g., depositing a metal layer, patterning the metal layer by etching, etc.).

After formation, the package substrate upper bonding pads 114*a* and package substrate lower bonding pads 116*a* may optionally undergo a surface roughening treatment (e.g., copper zarazara (CZ) treatment). In the surface roughening treatment, a surface of the package substrate upper bonding pads 114*a* (e.g., a copper surface) and surface of the package substrate lower bonding pads 116*a* (e.g., a copper surface) may be etched by an organic acid-type microetching solution, to create a super-roughened surface (e.g., copper surface). The uniquely-roughened copper surface topography of the package substrate upper bonding pads 114*a* and package substrate lower bonding pads 116*a* may help to achieve a high copper-to-resin adhesion.

The package substrate upper passivation layer 110*a* and package substrate lower passivation layer 110*b* may then be formed on the package substrate upper bonding pads 114*a* and package substrate lower bonding pads 116*a*, respectively. In at least one embodiment, the package substrate upper passivation layer 110*a* may include a solder resist layer (e.g., polymer material), also referred to as a solder mask. The package substrate upper passivation layer 110*a* may also be referred to as the upper solder resist layer 110*a*, and the package substrate lower passivation layer 110*b* may also be referred to as the lower solder resist layer 110*b*.

The package substrate upper passivation layer 110*a* and package substrate lower passivation layer 110*b* may be applied concurrently. The package substrate upper passivation layer 110*a* and package substrate lower passivation layer 110*b* may be applied, for example, as a liquid photo-imageable film. The liquid photo-imageable film can be applied, for example, by silk-screening or spraying the liquid photo-imageable film onto the surface of the package substrate 110. The liquid photo-imageable film may be applied over the package substrate upper bonding pads 114*a* and the package substrate lower bonding pads 116*a*. The package substrate upper passivation layer 110*a* and package substrate lower passivation layer 110*b* may alternatively be applied as a dry-film photo-imageable film that may be vacuum-laminated onto the surface of the package substrate 110 and over the package substrate upper bonding pads 114*a* and package substrate lower bonding pads 116*a*, respectively. The package substrate upper passivation layer 110*a* and package substrate lower passivation layer 110*b* may alternatively or additionally be formed, for example, by chemical vapor deposition (CVD), physical vapor deposition (PVD), spin coating, lamination or other suitable deposition technique.

The package substrate upper passivation layer 110*a* and package substrate lower passivation layer 110*b* may be applied to have a thickness that is slightly greater than a thickness of the package substrate upper bonding pads 114*a* and package substrate lower bonding pads 116*a*, respectively. Alternatively, the package substrate upper passivation layer 110*a* and package substrate lower passivation layer 110*b* may be applied so as to have an upper surface that is substantially coplanar with an upper surface of the package substrate upper bonding pads 114*a* and package substrate lower bonding pads 116*a*, respectively.

Openings $O_{110a}$ may then be formed in the package substrate upper passivation layer 110*a* so as to expose the upper surface of the package substrate upper bonding pads 114*a*. Openings $O_{110b}$ may be formed in the package substrate lower passivation layer 110*b* to expose an upper surface of the package substrate lower bonding pads 116*a*. The openings $O_{110a}$ and the openings $O_{110b}$ may be formed, for example, by using a photolithographic process. In at least one embodiment, the openings $O_{110a}$ and the openings $O_{110b}$ may be formed in separate photolithographic processes.

The photolithographic process (e.g., processes) used to form the openings $O_{110a}$ may include forming a patterned photoresist mask (not shown) on the package substrate upper passivation layer 110*a*, and etching (e.g., wet etching, dry etching, etc.) the exposed upper surface of the package substrate upper passivation layer 110*a* through openings in the photoresist mask. The photoresist mask may be subsequently removed by ashing, dissolving the photoresist mask or by consuming the photoresist mask during the etch process.

The photolithographic process (e.g., processes) used to form the openings $O_{110b}$ may include forming a patterned photoresist mask (not shown) on the package substrate lower passivation layer 110*b*, and etching (e.g., wet etching, dry etching, etc.) the exposed upper surface of the package substrate lower passivation layer 110*b* through openings in the photoresist mask. The photoresist mask may be subsequently removed by ashing, dissolving the photoresist mask or by consuming the photoresist mask during the etch process.

After the openings $O_{110a}$ are formed in the package substrate upper passivation layer 110*a* and the openings $O_{110b}$ are formed in the package substrate lower passivation layer 110*b*, the package substrate upper passivation layer 110*a* (upper solder resist layer) and the package substrate lower passivation layer 110*b* (lower solder resist layer) may be cured such as by a thermal cure or ultraviolet (UV) cure.

Figure 5B:
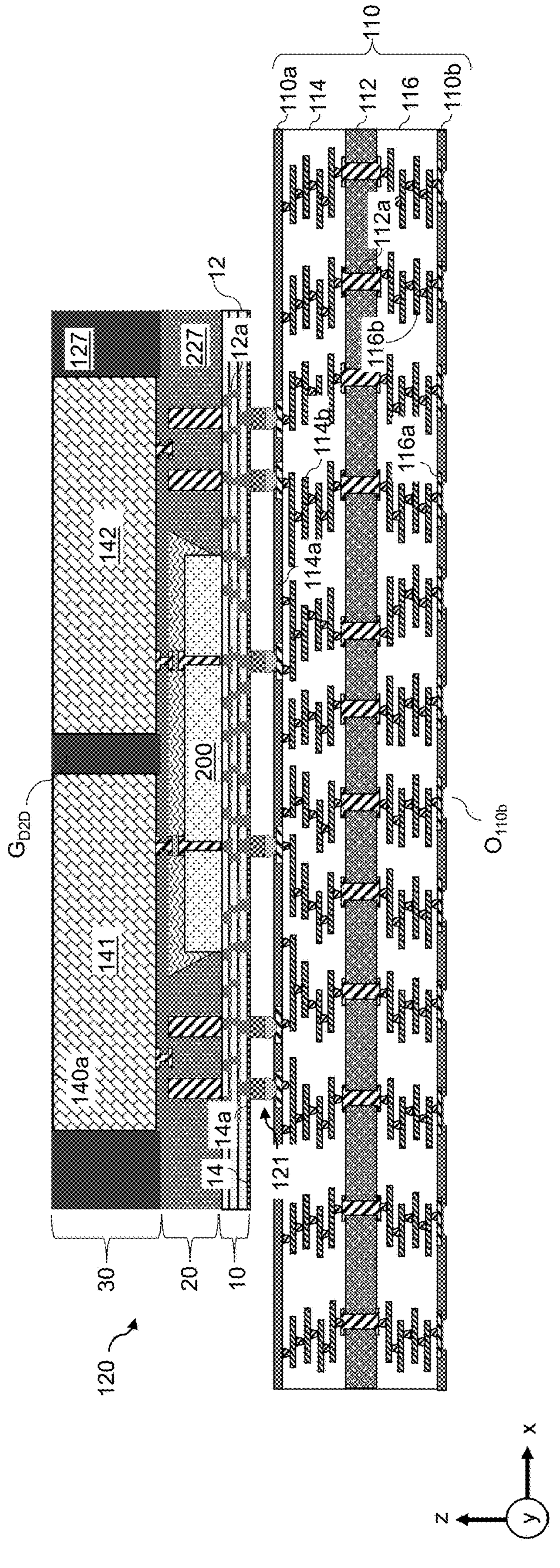
FIG. 5B illustrates a vertical cross-sectional view of an intermediate structure in which the package module may be mounted on the package substrate, according to one or more embodiments.

FIG. 5B illustrates a vertical cross-sectional view of an intermediate structure in which the package module 120 may be mounted on the package substrate 110, according to one or more embodiments. The package module 120 may be mounted on the package substrate 110, for example, by a flip chip bonding (FCB) process. The package module 120 may be positioned over the package substrate 110, for example, by an electromechanical pick-and-place (PNP) machine. The C4 bumps 121 on the package module 120 may then be lowered onto the package substrate upper bonding pads 114*a* of the package substrate 110 and heated in order to collapse the C4 bumps 121 and bond the C4 bumps 121 to the package substrate upper bonding pads 114*a*.

Figure 5C:
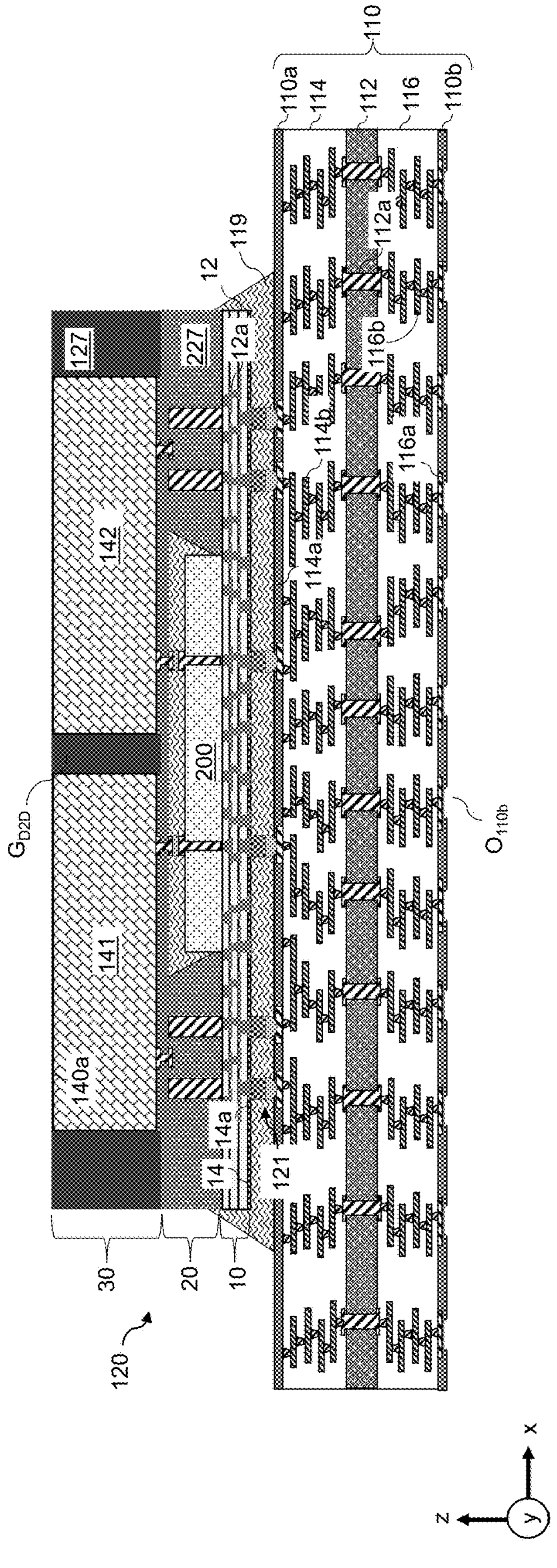
FIG. 5C illustrates a vertical cross-sectional view of an intermediate structure with outline of dummy bar superimposed on the vertical cross-sectional view in which the package underfill layer may be formed on the package substrate according to one or more embodiments.

FIG. 5C illustrates a vertical cross-sectional view of an intermediate structure with outline of dummy bar 500 superimposed on the vertical cross-sectional view in which the package underfill layer 119 may be formed on the package substrate 110 according to one or more embodiments. The package underfill layer 119 may be formed of an epoxy-based polymeric material. As illustrated in FIG. 5C, the package underfill layer 119 may be formed (e.g., injected) under and around the package module 120 and the C4 bumps 121 to the package substrate 110. The package underfill layer 119 may then be cured, for example, in a box oven for duration in a range from 60 minutes to 120 minutes at a temperature in a range from 120° C. to 180° C. to provide the package underfill layer 119 with a sufficient stiffness and mechanical strength.

Figure 5D:
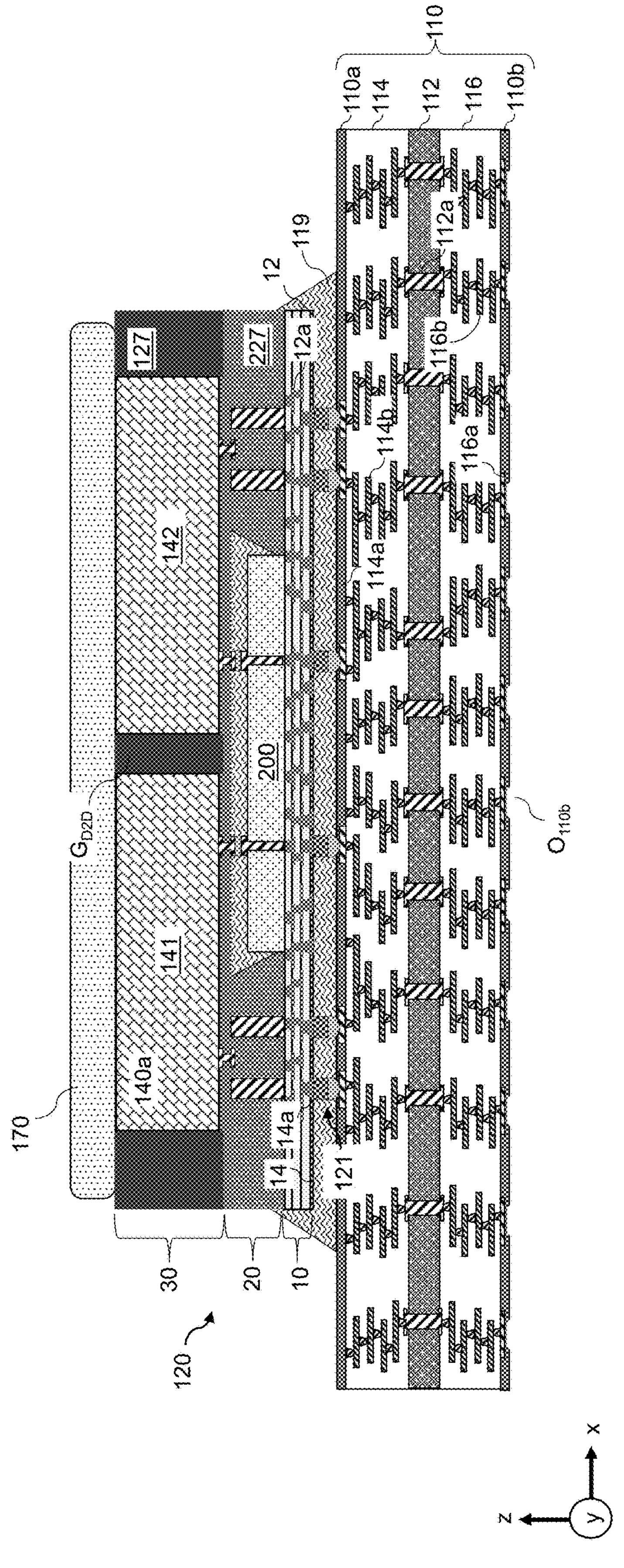
FIG. 5D illustrates a vertical cross-sectional view of an intermediate structure with outline of dummy bar superimposed on the vertical cross-sectional view in which the TIM layer may be attached to (e.g., formed on) the package module according to one or more embodiments.

FIG. 5D illustrates a vertical cross-sectional view of an intermediate structure with outline of dummy bar 500 superimposed on the vertical cross-sectional view in which the TIM layer 170 may be attached to (e.g., formed on) the package module 120 according to one or more embodiments. The TIM layer 170 may include, for example, a gel TIM, graphite TIM, metal TIM, solder TIM and a carbon nanotube TIM. The TIM layer 170 may be attached to the upper surface of the package module 120 by applying a thermally conductive adhesive to the upper surface of the package module 120 (or to a bottom surface of the TIM layer 170), and then pressing the TIM layer 170 onto the package module 120.

Figure 5E:
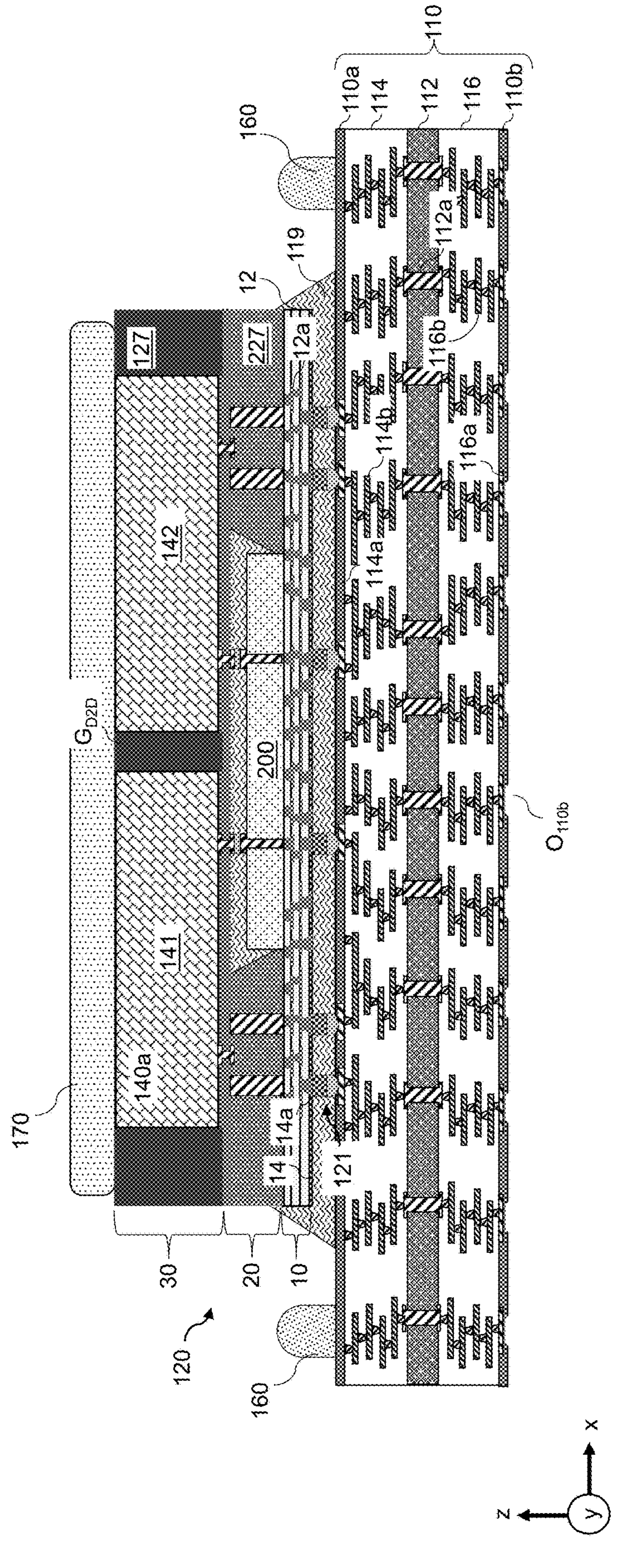
FIG. 5E illustrates a vertical cross-sectional view of an intermediate structure in which the adhesive layer may be applied to the package substrate according to one or more embodiments.

FIG. 5E illustrates a vertical cross-sectional view of an intermediate structure in which the adhesive layer 160 may be applied to the package substrate 110 according to one or more embodiments. The adhesive layer 160 may be dispensed onto the package substrate 110 with a dispensing tool (e.g., automated dispensing tool). The dispensing tool may dispense the adhesive layer 160 in a frame shape around the package module 120. At the time of application, the adhesive layer 160 may be sufficiently rigid so as to form a semi-solid bead on the surface of the package substrate 110. In at least one embodiment, a viscosity of each the adhesive layer 160 at the time of application may be 50,000 centipoise (cp) or greater. The shape of the semi-solid bead may remain substantially unchanged between the time of application by the dispensing tool and the later time of attaching the package lid 130. The location of the frame shape of the adhesive layer 160 may correspond to a location of the foot portion 130*a* of the package lid 130 (e.g., see FIG. 4B). A pressing of the package lid 130 onto the adhesive layer 160 may deform the adhesive layer 160.

Figure 5F:
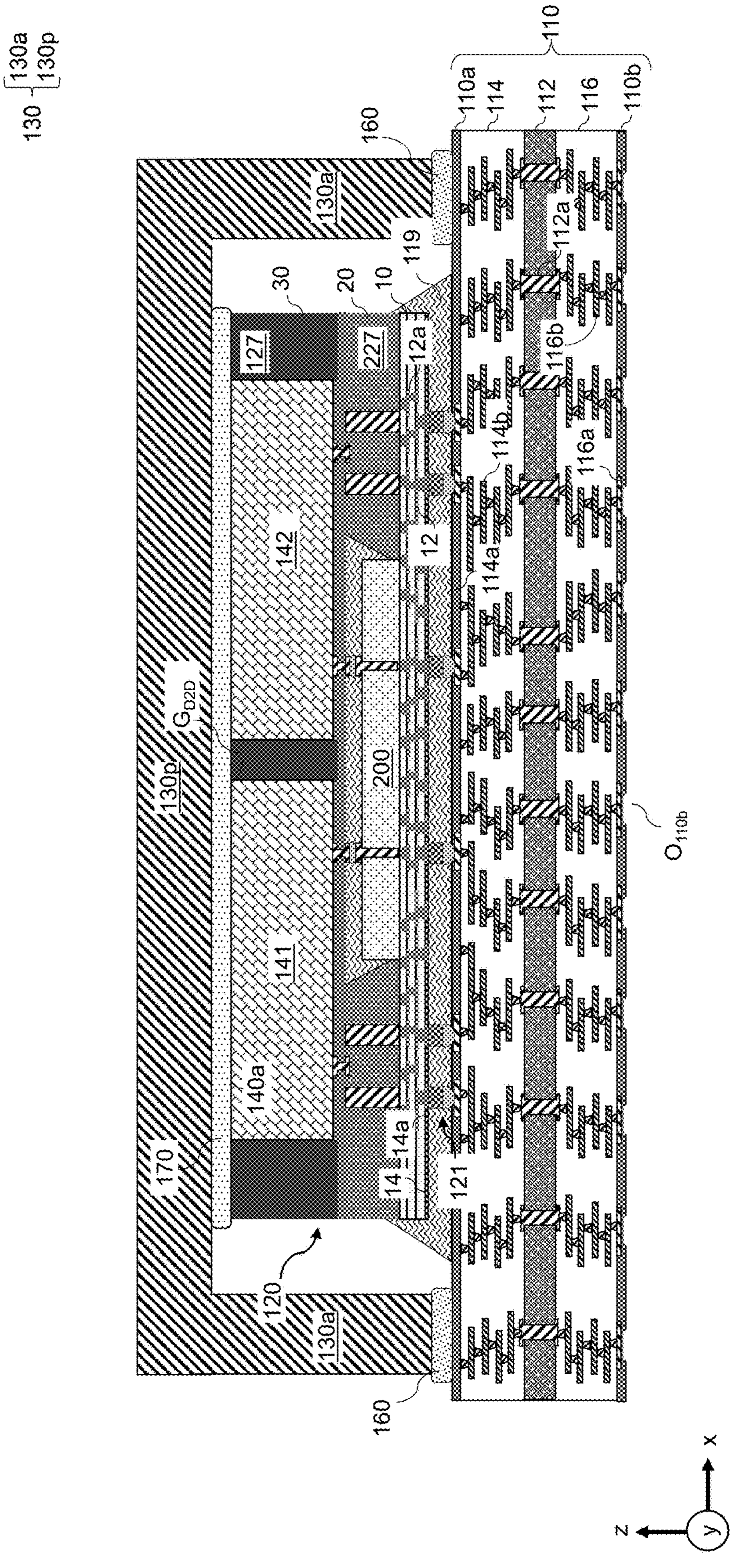
FIG. 5F illustrates a vertical cross-sectional view of an intermediate structure in which the package lid may be attached to (e.g., mounted on) the package substrate according to one or more embodiments.

FIG. 5F illustrates a vertical cross-sectional view of an intermediate structure in which the package lid 130 may be attached to (e.g., mounted on) the package substrate 110 according to one or more embodiments. After the package lid 130 is formed, for example, by milling using a computer numerical control (CNC) milling machine, or by molding or stamping, the package lid 130 may be attached to the package substrate 110. In at least one embodiment, the package substrate 110 with the package module 120 may be placed on a surface. The package lid 130 may then be positioned over the package substrate 110, for example, by an electromechanical pick-and-place (PNP) machine. The package lid 130 may then be lowered down over the package module 120 and onto the package substrate 110. The foot portion 130*a* of the package lid 130 may then be aligned with the adhesive layer 160 formed on the package substrate 110. The package lid 130 may then be pressed downward by applying a pressing force down onto the package lid 130 so that the foot portion 130*a* of the package lid 130 may be attached to the package substrate 110 through the adhesive layer 160.

Alternatively, the package lid 130 may be inverted (e.g., flipped) and placed on a surface (e.g., a flat surface), and the package substrate 110 with the package module 120 may be inverted and inserted into the package lid 130. The package substrate 110 and package module 120 may then be pressed by applying a pressing force down into the package lid 130 so that the foot portion 130*a* of the package lid 130 may be attached to the package substrate 110 through the adhesive layer 160. The pressing force may continue to be applied so that a bottom surface of the plate portion 130*p* contacts the TIM layer 170. The pressing force may cause the TIM layer 170 to be compressed by the bottom surface of the plate portion 130*p*.

The package lid 130 may be clamped to the package substrate 110 for a period to allow the adhesive layer 160 to cure and form a secure bond between the package substrate 110 and the package lid 130. The clamping of the package lid 130 to the package substrate 110 may be performed, for example, by using a heat clamp module. The heat clamp module may apply a uniform force across the upper surface of the package lid 130. In one or more embodiments, the heat clamp module may apply the pressing force to the package lid 130.

Figure 5G:
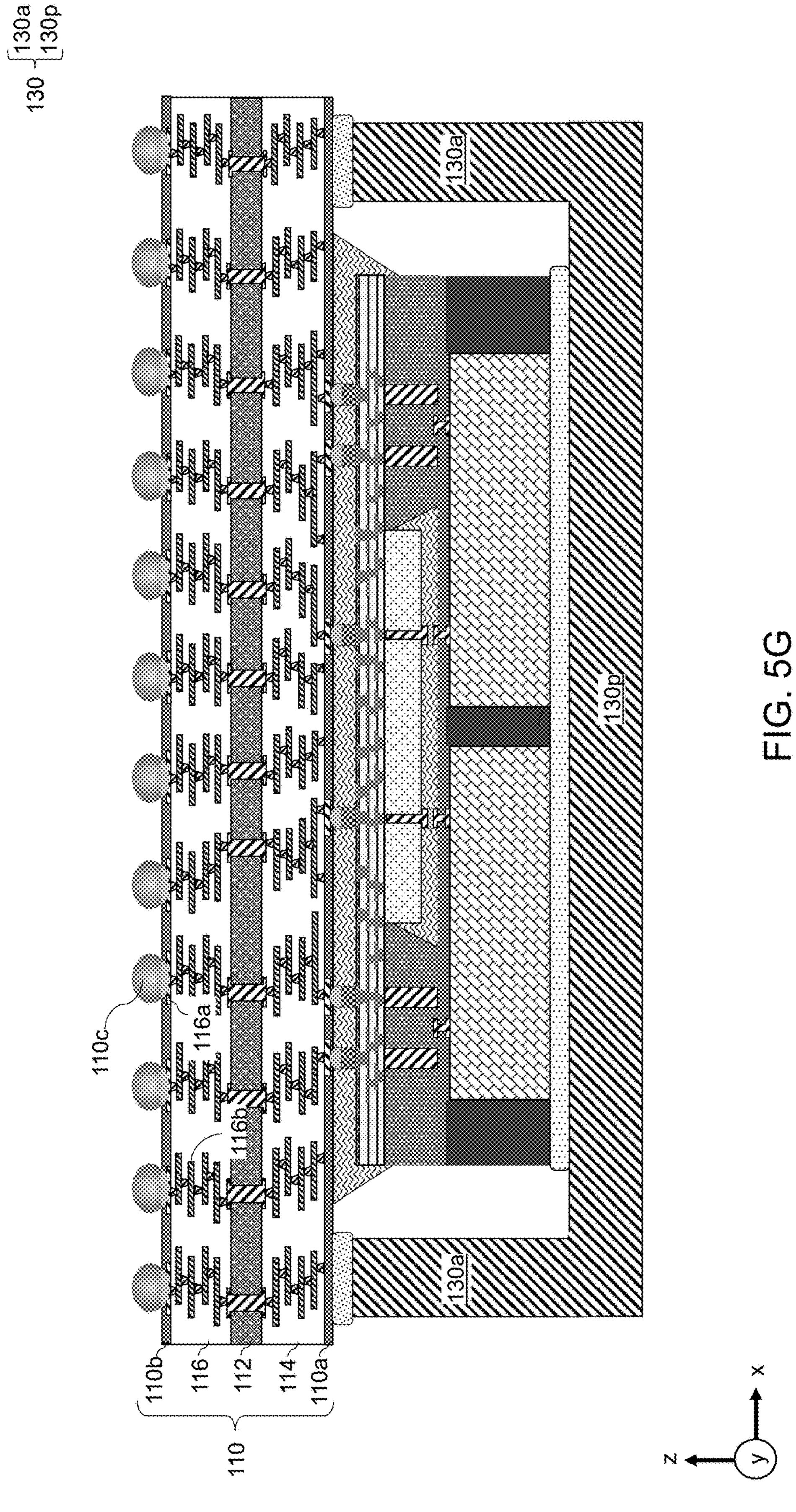
FIG. 5G illustrates a vertical cross-sectional view of an intermediate structure in which a plurality of solder balls may be formed on the package substrate according to one or more embodiments.

FIG. 5G illustrates a vertical cross-sectional view of an intermediate structure in which a plurality of solder balls 110*c* may be formed on the package substrate 110 according to one or more embodiments. The plurality of solder balls 110*c* may be formed on the package substrate lower bonding pads 116*a* through the openings $O_{110b}$ in the package substrate lower passivation layer 110*b*. The solder balls 110*c* may be formed, for example, by an electroplating process. The solder balls 110*c* may be formed, for example, so as to be located under the foot portion 130*a* and under the package module 120 and therebetween. The plurality of solder balls 110*c* may constitute a ball-grid array (BGA) that may allow the package 100 to be securely mounted (e.g., by surface mount technology (SMT)) on a substrate such as a printed circuit board and electrically coupled to the substrate. Formation of the solder balls 110*c* may complete the formation of the package 100.

Figure 6:
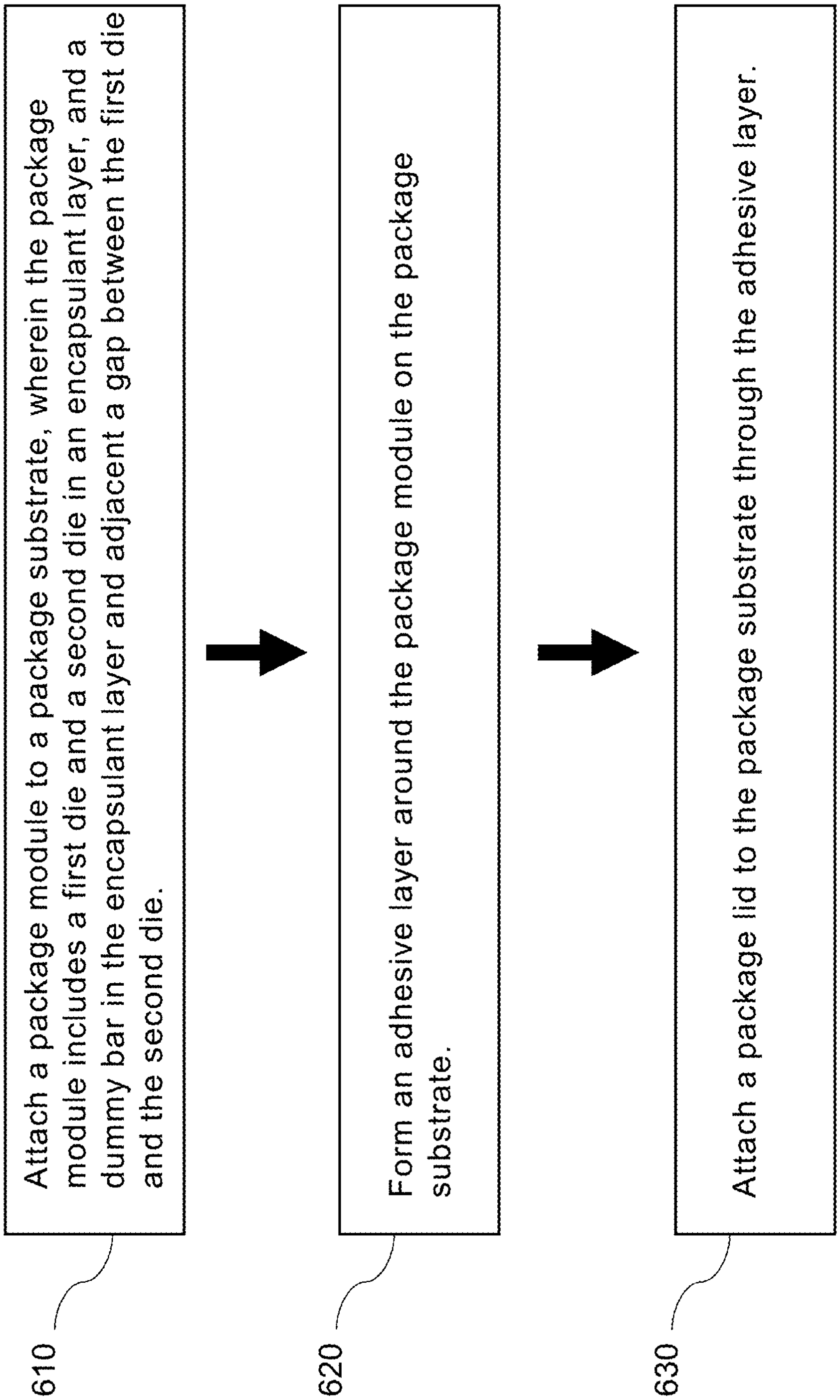
FIG. 6 is a flow chart illustrating a method of forming the package according to one or more embodiments.

FIG. 6 is a flow chart illustrating a method of forming the package 100 according to one or more embodiments. Step 610 includes attaching a package module to a package substrate, wherein the package module includes a first die and a second die in an encapsulant layer, and a dummy bar in the encapsulant layer and adjacent a gap between the first die and the second die. Step 620 includes forming an adhesive layer around the package module on the package substrate. Step 630 includes attaching a package lid to the package substrate through the adhesive layer.

Figure 7:
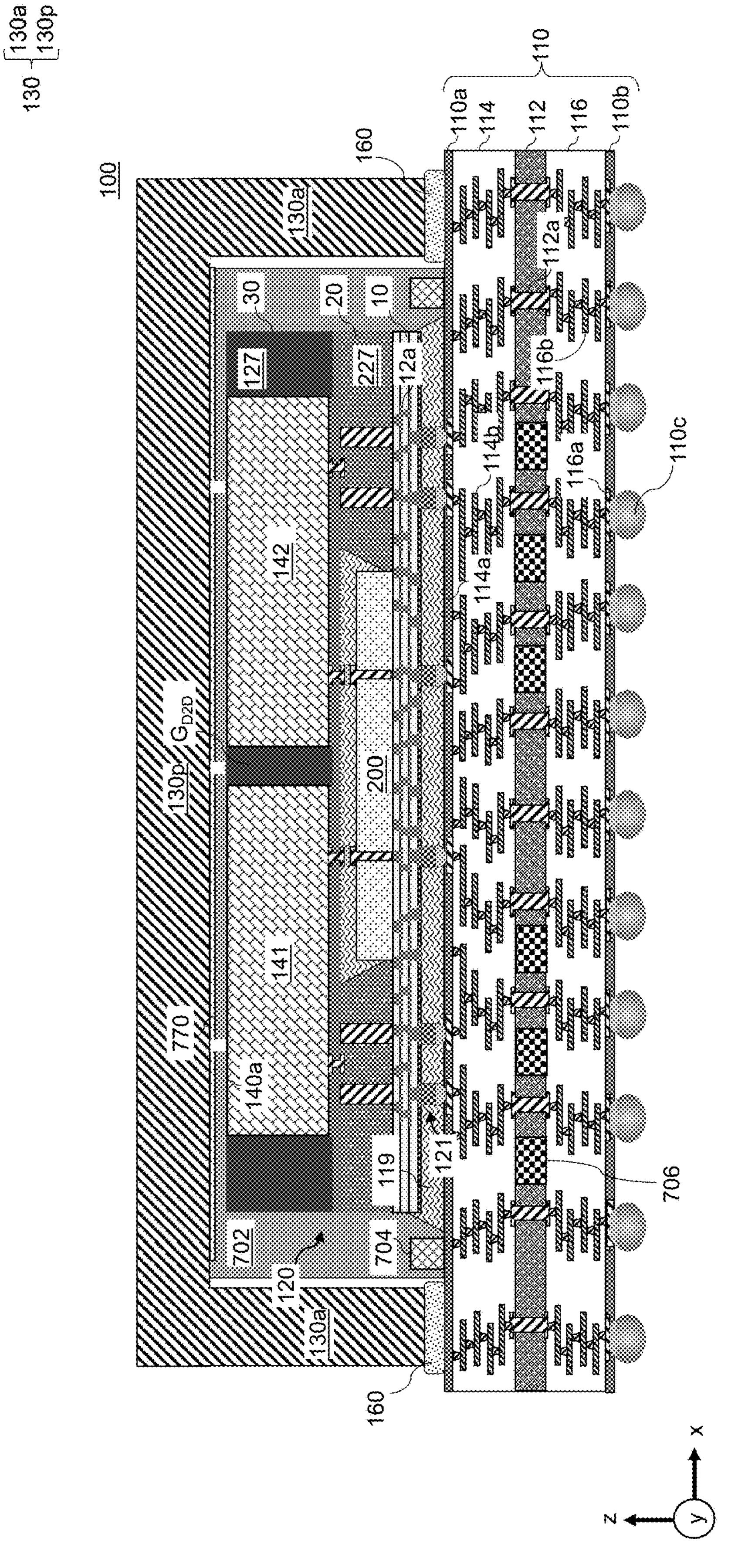
FIG. 7 is a vertical cross-sectional view of a package having a first alternative design, according to one or more embodiments.

FIG. 7 is a vertical cross-sectional view of a package 100 having a first alternative design, according to one or more embodiments. The package 100 having the first alternative design may have a structure substantially similar to that of the package 100 having the original design in FIG. 4A. However, in the alternative design, the package 100 may also include an outer molding layer 702 formed around the package module 120. The outer molding layer 702 may include a material substantially similar to the material of the lower molding layer 227 and encapsulant layer 127 (e.g., epoxy mold compound). In at least one embodiment, the package module 120 may be substantially embedded in the outer molding layer 702. In at least one embodiment, the outer molding layer 702 may be formed on all sides of the package module 120 except for the bottom surface of the package module 120 which is attached the package substrate 110. The plate portion 130*p* of the package lid 130 may be attached to an upper surface of the outer molding layer 702 through a thermal layer 770 (e.g., thermal paste, thermal adhesive, etc.).

The package 100 may also include on or more capacitors 704 attached to the chip-side surface of the package substrate 110. The capacitors 704 may include, for example, a multi-layer ceramic capacitor (MLCC). The capacitors 704 may be located near the package module 120 and embedded in the outer molding layer 702. In at least one embodiment, the capacitors 704 may be electrically coupled to the package module 120 through the package substrate 110.

The package 100 may also include one or more integrated passive devices (IPDs) 706. The IPDs 706 may be located in (e.g., embedded in) the core 112 of the package substrate 110. The IPDs 706 may include one or more electronic components such as resistors, capacitors, inductors, coils, chokes, microstriplines, impedance matching elements, baluns, etc. The IPDs 706 may be electrically coupled to the dies 140, for example, through the metal interconnect structures 114*b*, package substrate upper bonding pads 114*a*, RDL portion 10 and the lower module portion 20.

Figure 8B:
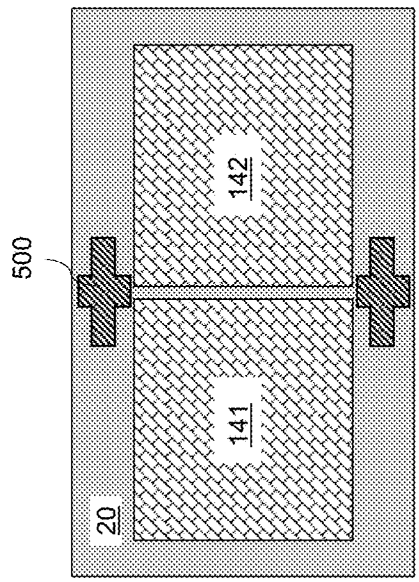
FIG. 8B is a plan view of a package module having a second alternative design, according to one or more embodiments.
Figure 8C:
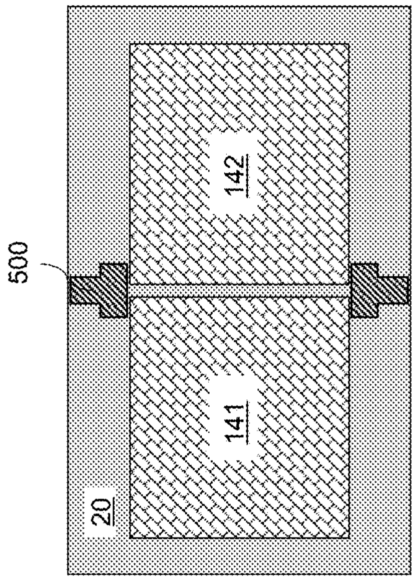
FIG. 8C is a plan view of a package module having a third alternative design, according to one or more embodiments.
Figure 8C:
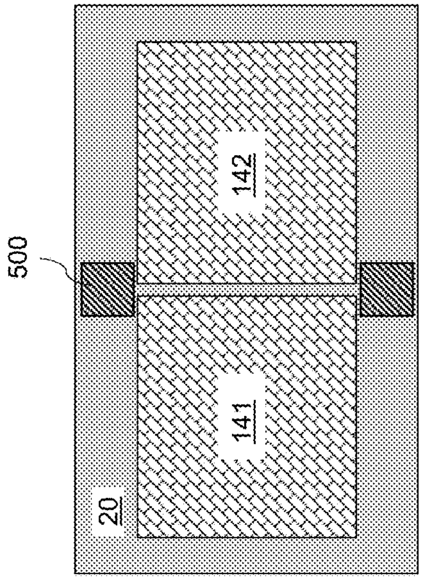
Figure 8A:
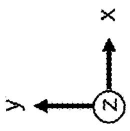
FIG. 8A is a plan view of a package module having a first alternative design, according to one or more embodiments.

FIGS. 8A-8C are plan views (top-down views) of package modules 120 having alternative designs, according to one or more embodiments. FIG. 8A is a plan view of a package module 120 having a first alternative design, according to one or more embodiments. In the first alternative design, the dummy bar 500 may have a square shape in the plan view. FIG. 8B is a plan view of a package module 120 having a second alternative design, according to one or more embodiments. In the second alternative design, the dummy bar 500 may have a cross shape in the plan view. FIG. 8C is a plan view of a package module 120 having a third alternative design, according to one or more embodiments. In the third alternative design, the dummy bar 500 may have a T-shape in the plan view.

Figure 9:
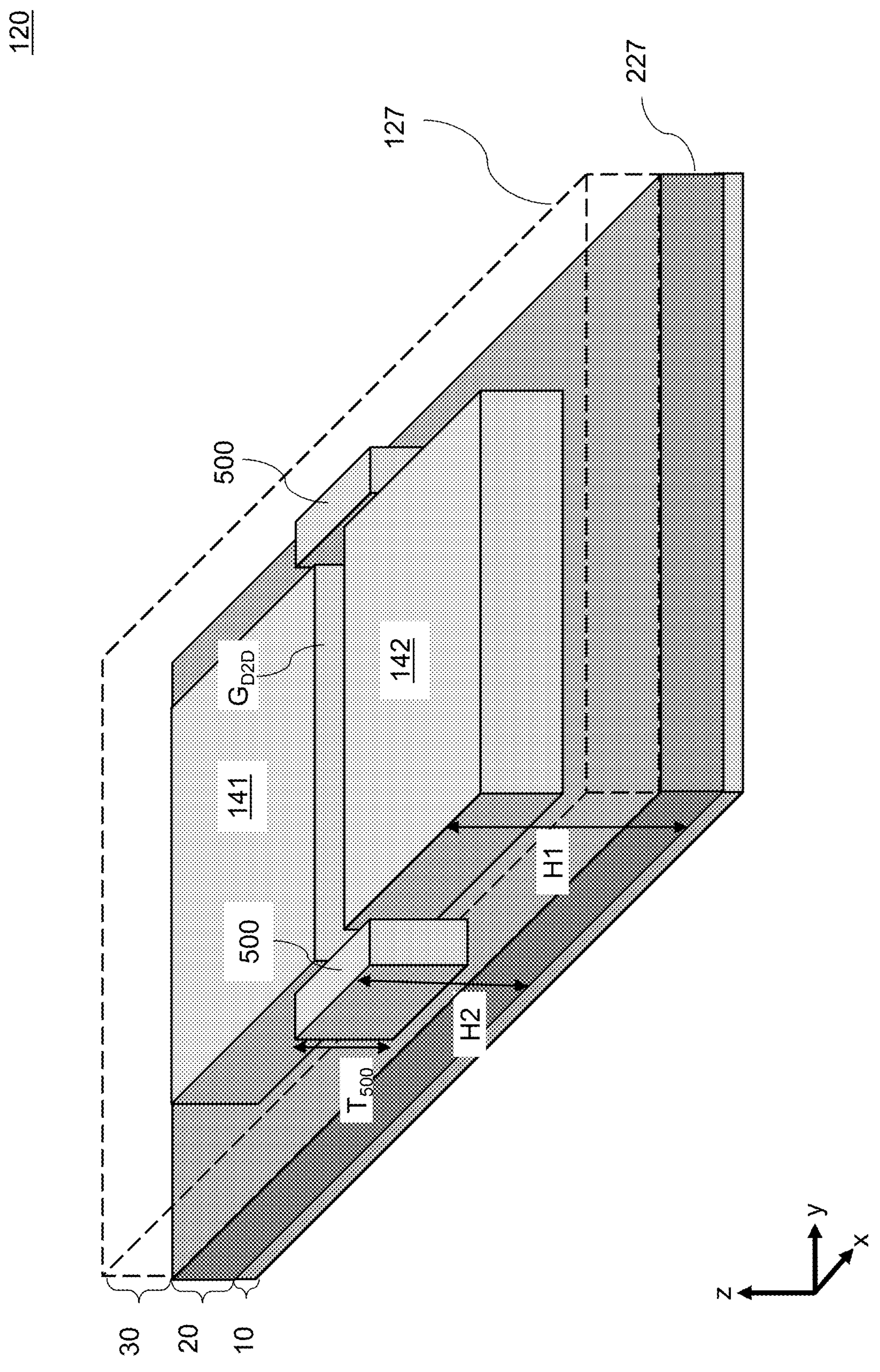
FIG. 9 is a perspective view of a package module having a fourth alternative design, according to one or more embodiments.

FIG. 9 is a perspective view of a package module 120 having a fourth alternative design, according to one or more embodiments. As illustrated in FIG. 9, in the fourth alternative design, the dummy bar 500 may have a thickness T500 substantially the same as a thickness of the dies 140. The thickness T500 of the dummy bar 500 may also be substantially the same as the thickness of the encapsulant layer 127. With this embodiment, a surface of the dummy bar 500 may be planarized in the planarizing step of the encapsulant layer 127 (e.g., see FIG. 2B).

In at least one embodiment, the dummy bar 500 may be attached by an adhesive to the lower molding layer 227 of the lower module portion 20. In that case, the height H2 of the upper surface of the dummy bar 500 may be substantially equal to the height H1 of the upper surface of the encapsulant layer 127 (e.g., upper surface of the upper module portion 30, upper surface 140*a* of the dies 140), or less than the height H1 of the upper surface of the encapsulant layer 127. In at least one embodiment, a ratio of a height of an upper surface of the encapsulant layer 127 to a height of an upper surface of the dummy bar 500 may be in a range from 1 to 10.

Referring now to FIGS. 1A-9, a package 100 may include a first die 141 and a second die 142 in an encapsulant layer 127, and a dummy bar 500 in the encapsulant layer 127 and adjacent a gap $G_{D2D}$ between the first die and the second die 142. In one embodiment, the second die 142 may be adjacent to the first die 141 in a first direction, the gap $G_{D2D}$ extends longitudinally in a second direction perpendicular to the first direction and a center of the dummy bar 500 in the first direction may be substantially aligned with a center of the gap $G_{D2D}$ in the first direction. In one embodiment, the dummy bar 500 may include a rectangular shape in a plan view and includes a long side in the first direction and a short side in the second direction. a length of the long side of the dummy bar 500 may be in a range from 1 mm to 30 mm and a length of the short side of the dummy bar 500 may be in a range from 0.1 mm to 10.0 mm. In one embodiment, a ratio of a length of the encapsulant layer 127 in the first direction to the length of the long side of the dummy bar 500 may be in a range from 1.5 to 15. In one embodiment, the encapsulant layer 127 may be in the gap $G_{D2D}$ and the dummy bar 500 may be adjacent to the encapsulant layer 127 in the second direction. In one embodiment, a thickness T500 of the dummy bar 500 may be in a range from 10 μm to 5000 μm. In one embodiment, the dummy bar 500 may include a silicon bar. In one embodiment, a ratio of a height of an upper surface of the encapsulant layer to a height of an upper surface of the dummy bar 500 may be in a range from 1 to 10. In one embodiment, an upper surface of the dummy bar 500 may be substantially coplanar with an upper surface of the first die 141 and the second die 142. In one embodiment, the package 100 may further include a package module 120 including a lower module portion 20 including a lower molding layer 227 and a local silicon interconnect (LSI) die 200 in the lower molding layer 227, and an upper module portion 30 on the lower module portion 20 and including the encapsulant layer 127 and the first die 141, the second die 142 and the dummy bar 500 in the encapsulant layer 127. In one embodiment, the dummy bar 500 may be mounted on the lower molding layer 227 of the lower module portion 20 and may be separated from the first die 141 and the second die 142 in a second direction. In one embodiment, the LSI die 200 may be configured to connect the first die 141 and the second die 142, and the gap is over the LSI die 200 in a third direction perpendicular to a first direction and a second direction. In one embodiment, the encapsulant layer 127 may contact the lower molding layer 227 between the dummy bar 500 and the first die 141 and the second die 142 and between the dummy bar 500 and an edge of the lower molding layer 227.

Referring again to FIGS. 1A-9, a method of forming a package 100 may include attaching a first die 141 and a second die 142 to a surface, attaching a dummy bar 500 to the surface adjacent a gap $G_{D2D}$ between the first die 141 and the second die 142, and forming an encapsulant layer 127 on the first die 141, the second die 142 and the dummy bar 500. In one embodiment, the attaching of the first die 141 and the second die 142 may include attaching the first die 141 and the second die 142 such that the second die 142 may be adjacent to the first die 141 in a first direction and the gap $G_{D2D}$ extends longitudinally in a second direction perpendicular to the first direction. In one embodiment, the attaching of the dummy bar 500 may include attaching the dummy bar 500 such that a center of the dummy bar 500 in the first direction may be substantially aligned with a center of the gap $G_{D2D}$ in the first direction, and such that a long side of the dummy bar 500 extends in the first direction and a short side of the dummy bar 500 extends in the second direction. In one embodiment, the forming of the encapsulant layer 127 may include forming the encapsulant layer 127 in the gap $G_{D2D}$ such that the dummy bar 500 may be adjacent to the encapsulant layer 127 in the second direction. In one embodiment, the method may further include forming a package module 120 including a lower module portion 20 including a lower molding layer 227 and a local silicon interconnect (LSI) die 200 in the lower molding layer 227, and an upper module portion 30 on the lower module portion 20, wherein the attaching of the first die 141 and the second die 142 may include attaching the first die 141 and the second die 142 to a surface of the lower molding layer 227, the attaching of the dummy bar 500 may include attaching the dummy bar 500 to the surface of the lower molding layer 227, and the forming of the encapsulant layer 127 may include forming the encapsulant layer 127 on the first die 141, the second die 142 and the dummy bar 500 in the upper module portion 30.

Referring again to FIGS. 1A-9, a package 100 may include a package substrate 110, a package module 120 on the package substrate 110, including a first die 141 and a second die 142 in an encapsulant layer 127, and a dummy bar 500 in the encapsulant layer 127 and adjacent a gap $G_{D2D}$ between the first die 141 and the second die 142, and a package lid 130 on the package module 120 and attached to the package substrate 110.

The above-described embodiments may provide a package module 120, package 100 and methods of forming the package module 120 and package 100 that may be advantageous in terms of improved bending strength (e.g., flexural strength) and bending displacement (e.g., flexural displacement). In particular, under a bending stress (e.g., a flexural stress applied downwardly near the gap $G_{D2D}$) the package module 120 including one or more dummy bars 500 may have a greater bending strength (e.g., at least an 18% increase) and bending displacement (e.g., at least a 21% increase) compared to a package module without the dummy bars 500. The dummy bars 500 may, therefore, increase the rigidity of the package module 120 and thereby help to reduce a risk of die-to-die crack (e.g., a crack in the molding material layer 127 in or around the gap $G_{D2D}$) due to a bending stress (e.g., flexural stress) on the package module 120 and therefore, improve yield loss.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package, comprising:

a lower molding layer extending lengthwise in a first direction;

a first die and a second die on the lower molding layer and separated by a gap extending lengthwise in a second direction perpendicular to the first direction;

an encapsulant layer around the first die and the second die; and a dummy bar in the encapsulant layer and a outside the gap between the first die and the second die, wherein the dummy bar extends lengthwise in the first direction and a center of the dummy bar in the first direction is substantially aligned with a center of the gap in the first direction.

2. The package of claim 1, wherein the second die is substantially aligned with the first die in the first direction.

3. The package of claim 2, wherein the dummy bar comprises a rectangular shape in a plan view and includes a long side in the first direction and a short side in the second direction.

4. The package of claim 3, wherein a length of the long side of the dummy bar is in a range from 1 mm to 30 mm and a length of the short side of the dummy bar is in a range from 0.1 mm to 10.0 mm.

5. The package of claim 3, wherein a ratio of a length of the encapsulant layer in the first direction to the length of the long side of the dummy bar is in a range from 1.5 to 15.

6. The package of claim 2, wherein the encapsulant layer is in the gap and the dummy bar is adjacent to the encapsulant layer in the second direction.

7. The package of claim 1, wherein a thickness of the dummy bar is in a range from 10 μm to 5000 μm.

8. The package of claim 1, wherein the dummy bar comprises a silicon bar.

9. The package of claim 1, wherein a ratio of a height of an upper surface of the encapsulant layer to a height of an upper surface of the dummy bar is in a range from 1 to 10.

10. The package of claim 1, wherein an upper surface of the dummy bar is substantially coplanar with an upper surface of the first die and the second die.

11. The package of claim 1, further comprising:

a package module comprising:

a lower module portion including the lower molding layer and a local silicon interconnect (LSI) die in the lower molding layer; and an upper module portion on the lower module portion and including the encapsulant layer and the first die, the second die and the dummy bar in the encapsulant layer.

12. The package of claim 11, wherein the dummy bar is mounted on the lower molding layer of the lower module portion and is separated from the first die and the second die in a second direction.

13. The package of claim 11, wherein the LSI die is configured to connect the first die and the second die, and the gap is over the LSI die in a third direction perpendicular to a first direction and a second direction.

14. The package of claim 12, wherein the encapsulant layer contacts the lower molding layer between the dummy bar and the first and second dies and between the dummy bar and an edge of the lower molding layer.

15. A method of forming a package, the method comprising:

attaching a first die and a second die to a surface;

attaching a dummy bar to the surface outside a gap between the first die and the second die;

forming an encapsulant layer on the first die, the second die and the dummy bar;

forming a lower molding layer on the first die and the second die, wherein the lower molding layer extends lengthwise in a first direction, the gap extends lengthwise in a second direction perpendicular to the first direction, the dummy bar extends lengthwise in the first direction and a center of the dummy bar in the first direction is substantially aligned with a center of the gap in the first direction.

16. The method of claim 15, wherein the attaching of the first die and the second die comprises attaching the first die and the second die such that the second die is adjacent to substantially aligned with the first die in the first direction.

17. The method of claim 16, wherein the dummy bar has a rectangular shape and the attaching of the dummy bar comprises attaching the dummy bar such that a long side of the dummy bar extends in the first direction and a short side of the dummy bar extends in the second direction.

18. The method of claim 16, wherein the forming of the encapsulant layer comprises forming the encapsulant layer in the gap such that the dummy bar is adjacent to the encapsulant layer in the second direction.

19. The method of claim 15, further comprising:

forming a package module including:

a lower module portion including the lower molding layer and a local silicon interconnect (LSI) die in the lower molding layer; and an upper module portion on the lower module portion, wherein the attaching of the first die and the second die comprises attaching the first die and the second die to a surface of the lower molding layer, the attaching of the dummy bar comprises attaching the dummy bar to the surface of the lower molding layer, and the forming of the encapsulant layer comprises forming the encapsulant layer on the first die, the second die and the dummy bar in the upper module portion.

20. A package, comprising:

a package substrate;

a package module on the package substrate, comprising:

a lower molding layer extending lengthwise in a first direction;

a first die and a second die on the lower molding layer and separated by a gap extending lengthwise in a second direction perpendicular to the first direction;

an encapsulant layer around the first die and the second die; and a dummy bar in the encapsulant layer and outside the gap between the first die and the second die, wherein the dummy bar extends lengthwise in the first direction and a center of the dummy bar in the first direction is substantially aligned with a center of the gap in the first direction; and a package lid on the package module and attached to the package substrate.

* * * * *